United States Patent [19]
Kobayashi et al.

[11] Patent Number: 5,646,948
[45] Date of Patent: Jul. 8, 1997

[54] APPARATUS FOR CONCURRENTLY TESTING A PLURALITY OF SEMICONDUCTOR MEMORIES IN PARALLEL

[75] Inventors: Shinichi Kobayashi, Kounosu; Toshimi Ohsawa, Gyoda; Tadashi Okazaki, Kazo; Kazumi Kita, Gyoda; Junichi Kanai, Kazo; Tadahiko Baba, Gyoda, all of Japan

[73] Assignee: Advantest Corporation, Tokyo, Japan

[21] Appl. No.: 297,924

[22] Filed: Aug. 31, 1994

[30] Foreign Application Priority Data

Sep. 3, 1993 [JP] Japan ................................. 5-219746
Sep. 13, 1993 [JP] Japan ................................. 5-227148
Sep. 13, 1993 [JP] Japan ................................. 5-227172
Oct. 21, 1993 [JP] Japan ................................. 5-061404 U
Dec. 27, 1993 [JP] Japan ................................. 5-331471

[51] Int. Cl.$^6$ .................... G01R 31/28; G06F 7/38; G06F 11/00; G11C 7/00
[52] U.S. Cl. .................... 371/21.2; 365/195; 371/27
[58] Field of Search ......................... 371/21.2, 24, 27, 371/21.1; 365/201, 195, 196

[56] References Cited

U.S. PATENT DOCUMENTS

| 4,149,270 | 4/1979 | Criechi et al. | 365/184 |
|---|---|---|---|
| 4,369,511 | 1/1983 | Kimura et al. | 371/21.1 |
| 4,751,721 | 6/1988 | Wissell | 377/20 |
| 4,796,215 | 1/1989 | Hatta | 364/706 |
| 4,931,993 | 6/1990 | Urushima | 365/189.01 |
| 5,097,445 | 3/1992 | Yamauchi | 365/195 |
| 5,111,433 | 5/1992 | Miyamoto | 365/201 |
| 5,394,361 | 2/1995 | Dickinson | 365/189.04 |

Primary Examiner—Hoa T. Nguyen
Attorney, Agent, or Firm—Staas & Halsey

[57] ABSTRACT

A test data pattern, an address pattern, and a control signal are supplied from a pattern generator to a test memory. Data read from the test memory is compared with expected data by an XOR gate. When they match, a compared result that represents pass is output. When they mismatch, a compared result that represents fail is output. A match signal WC detected by the XOR gate is held in a register. The register outputs an inhibition signal to an inhibition gate of the test memory. Thus, a write enable signal WE is inhibited from being supplied to the test memory. In addition, the inhibition signal is supplied to a compared result inhibition gate. The compared result inhibition gate causes the compared result to be passed and prevents the test memory from being excessively written.

15 Claims, 24 Drawing Sheets

PRIOR ART

FIG. 19

| ADRS | AR1 | | AR2 | AR3 | AR4 |
|---|---|---|---|---|---|
| STO | NOP | | INITIALIZE ADRS | INITIALIZE DATA | PROG SETUP |
| | JIP | ST1 | | | |
| | NOP | | | | PROG |
| | NOP | | | | |
| | NOP | | | | PROG VERIFY |
| ST1 | JMX | STO | ADD ← ADD+1 | | |

APPARATUS FOR CONCURRENTLY TESTING A PLURALITY OF SEMICONDUCTOR MEMORIES IN PARALLEL

BACKGROUND OF THE INVENTION

The present invention relates to an apparatus for testing a semiconductor memory such as a dynamic random access memory (DRAM), a static random access memory (SRAM), a flash memory or similar memory. More particularly, the present invention is directed to, but not exclusively limited to, a memory testing apparatus which is capable of concurrently testing a plurality of semiconductor flash memories in parallel.

FIG. 1 is a block diagram showing the basic construction of a conventional semiconductor memory test apparatus. The semiconductor memory test apparatus comprises a timing generator 10, pattern generator 2, a waveform shaper 3, a drivers DR, a logical comparing part 40, and a fail analyzing memory 5. The semiconductor memory test apparatus tests a memory under test MUT (hereinafter the memory under MUT is referred to as simply test memory MUT). When the semiconductor memory test apparatus is used only for determining whether a semiconductor memory is normal/abnormal (PASS/FAIL), the fail analyzing memory 5 may not be used.

The pattern generator 2 outputs an address signal ADRS, a test data signal TPD, and a control signal CS to the test memory MUT in accordance with a basic clock CK generated by the timing generator 10. These signals are supplied to the waveform shaper 3. These signals are shaped to logical waveforms necessary for the test and the voltage thereof is raised by the driver DR. The resultant signals are applied to the test memory MUT.

With the control signal CS, the test data signal TPD is written to and read from the test memory MUT. The test data signal RD read from the test memory MUT is supplied to a logical comparing part 40. The logical comparing part 40 compares expected data ED output from the pattern generator 2 with the test data RD being read. Depending on whether or not the expected data ED matches with the test data RD, it is determined whether the test memory MUT is good or no good (PASS or FALL).

When a mismatch is detected, the logical comparing part 40 supplies a fail signal to a fail analyzing memory 5. The fail information is stored in a memory cell of the fail analyzing memory 5, the memory cell being designated with an address signal ADRS generated by the pattern generator 2. After the test is completed, the content stored in the fail analyzing memory 5 is analyzed.

In a conventional fabrication line, n test memories $MUT_1$ to $MUT_n$ are tested in parallel on n test channels so as to improve test efficiency.

Next, the flash memory will be described.

In recent years, the flash memory is a non-volatile memory having a gained attention by those in the art. The flash memory has large storage capacity and data stored therein can be rewritten many times. However, due to the construction of the flash memory, with one write operation, data cannot be always successfully written so each address. Thus, normally, the write operation should be repeated several times. The number of times of the write operation required depends on the type of the test memory MUT. In addition, even if the type of the test memory MUT is the same, the number of times of the write operation required depends on each address thereof. In the data write test for the flash memory, when data have been written to all required memory cells within a predetermined number of times, it is determined that the memory is good. In the data erase test for the flash memory, when data have been erased from all required memory cells within a predetermined number of times, it is determined that the memory is good.

FIG. 2 shows the construction of the logical comparing part 40 having n test channels. The logical comparing part 40 comprises a plurality of logical comparators $4_1$ to $4_n$ and an allpass detector 43. The logical comparators $4_1$ to $4_n$ receive data RD from the test memories $MUT_1$ to $MUT_n$ and logically compare the data RD with expected data ED. The allpass detector 43 is constructed of an NOR gate. In this example, in each of the logical comparators $4_1$ to $4n$, a mismatch detecting circuit 4X that is constructed of an XOR gate compares analog logical determined result with the expected data ED at the timing of strobe STRB of input data. When the compared result is match (PASS), the circuit 4X outputs "0". When the compared result is mismatch (FAIL), the circuit 4X outputs "1". The logical comparators $4_1$ to $4_n$ supply the compared results that are FAIL/PASS status data (or simply, F/P data) to the fail analyzing memory 5 and the allpass detector 43. The allpass detector 43 outputs a match flag MF representing "1" to the pattern generator 2.

When a plurality of flash memories are tested in parallel at the same time, if the read data RD at a particular address of all the test flash memories $MUT_1$ to $MUT_n$ matches with the expected data ED, the match flag MF takes place. With the match flag MF, the pattern generator 2 outputs expected data of the next address. When the expected data does not match with the read data of the test flash memories $MUT_1$ to $MUT_n$ the data write test (or data erase test) is performed at the same address. (In the following description, only the data write test will be explained.) When the data write test is repeated a predetermined number of times, if the expected data does not match with the read data of the test flash memories $MUT_1$ to $MUT_n$, the flow jumps to another process routine and stores data representing that the test flash memory MUT is FAIL to a corresponding address of the fail analyzing memory 5.

However, the flash memory has excessively write inhibition characteristic where data cannot be excessively written to an address where data has been successfully written. Thus, when a plurality of flash memories $MUT_1$ to $MUT_n$ are attempted to be tested in parallel at the same time, as described above, the number of times of data write operation required depends on each flash memory MUT. Thus, if the data write operation is performed for a flash memory MUT where data has not been successfully written, the same operation is also executed for other flash memories MUT where the data write operation has been successfully performed. Consequently, such an attempt violates the excessively write inhibition characteristic of the flash memories MUT. This requirement applies to the data erase test.

As a result, so far, a plurality of flash memories could not be tested in parallel at the same time.

SUMMARY OF THE INVENTION

An object of the present invention is to provide a semiconductor memory test apparatus for performing write test and erase test free from excessive write operation and excessive erase operation. The present invention is a semiconductor memory test apparatus, comprising a pattern generating means for generating an address pattern, a test data pattern, expected data, and a control signal corresponding to a program for determining a pattern generation sequence, the address pattern being adapted for designating an address of a test memory, the test data pattern being written to the designated address of the test memory, the expected data being compared with data read from the designated address of the test memory, the control signal including an operation status control signal for controlling the operation status of the test memory, a comparing means for determining whether the data read from the test memory matches with the expected data, for outputting a compared result that represents a pass when the read data matches with the expected data, and for outputting a compared result that represents a fail when the read data does not match with the expected data, an inhibition signal holding means for holding the compared result and for outputting the compared result as an inhibition signal when the comparing means detects the match, an inhibition gate means for receiving the inhibition signal and for inhibiting the operation status control signal from being supplied to the test memory so as to prevent the test memory form being excessively written, and a compared result inhibition means disposed on the output side of the comparing means and adapted for inhibiting the compared result from being output corresponding to the inhibition signal, an input of the comparing means being connected to an output of the compared result inhibition means.

These and other objects, features and advantages of the present invention will become more apparent in light of the following detailed description of best mode embodiments thereof, as illustrated in the accompanying drawings.

BRIEF DESCRIPTION OF DRAWINGS

FIG. 19 is a schematic diagram showing a part of an instruction program stored in an instruction memory;

DESCRIPTION OF THE PREFERRED EMBODIMENTS (First Embodiment)

Figure 3:
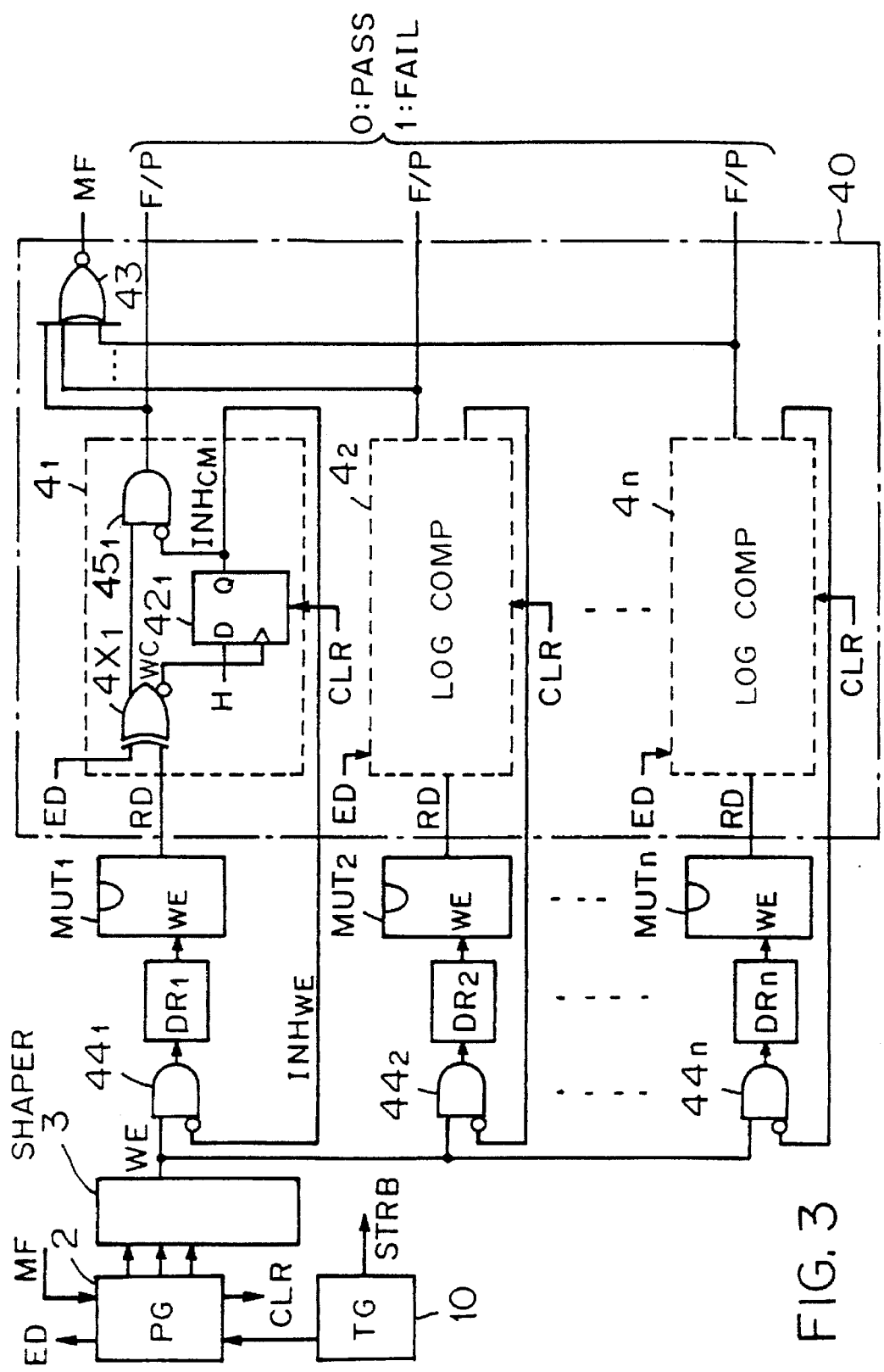
FIG. 3 is a block diagram showing the construction of an apparatus for preventing excessive write operation corresponding to a first embodiment of the present invention.

FIG. 3 is a block diagram showing a semiconductor memory test apparatus according to a first embodiment of the present invention. As with the abovedescribed prior art reference shown in FIG. 1, the semiconductor memory test apparatus comprises a timing generator 10, a pattern generator 2, a waveform shaper 3, a logical comparing part 40, and an all-pass detector (NOR gate) 43. When the memory test apparatus performs a fail analyzing operation, it further comprises a fail analyzing memory shown in FIG. 1. In the first embodiment shown in FIG. 3, write inhibit gates $44_1$, $44_2$, ... $44_n$ are disposed on the input side of drivers $DR_1$, $DR_2$, ... $DR_n$ that supply write enable signals WE to n test memories $MUT_1$, $MUT_2$, ... $MUT_n$ that are in n test channels, respectively.

As shown in FIG. 3, the logical comparing part 40 has logical comparators $4_1$, $4_2$, ... $4_n$ which are in n test channels, respectively.

Figure 2:
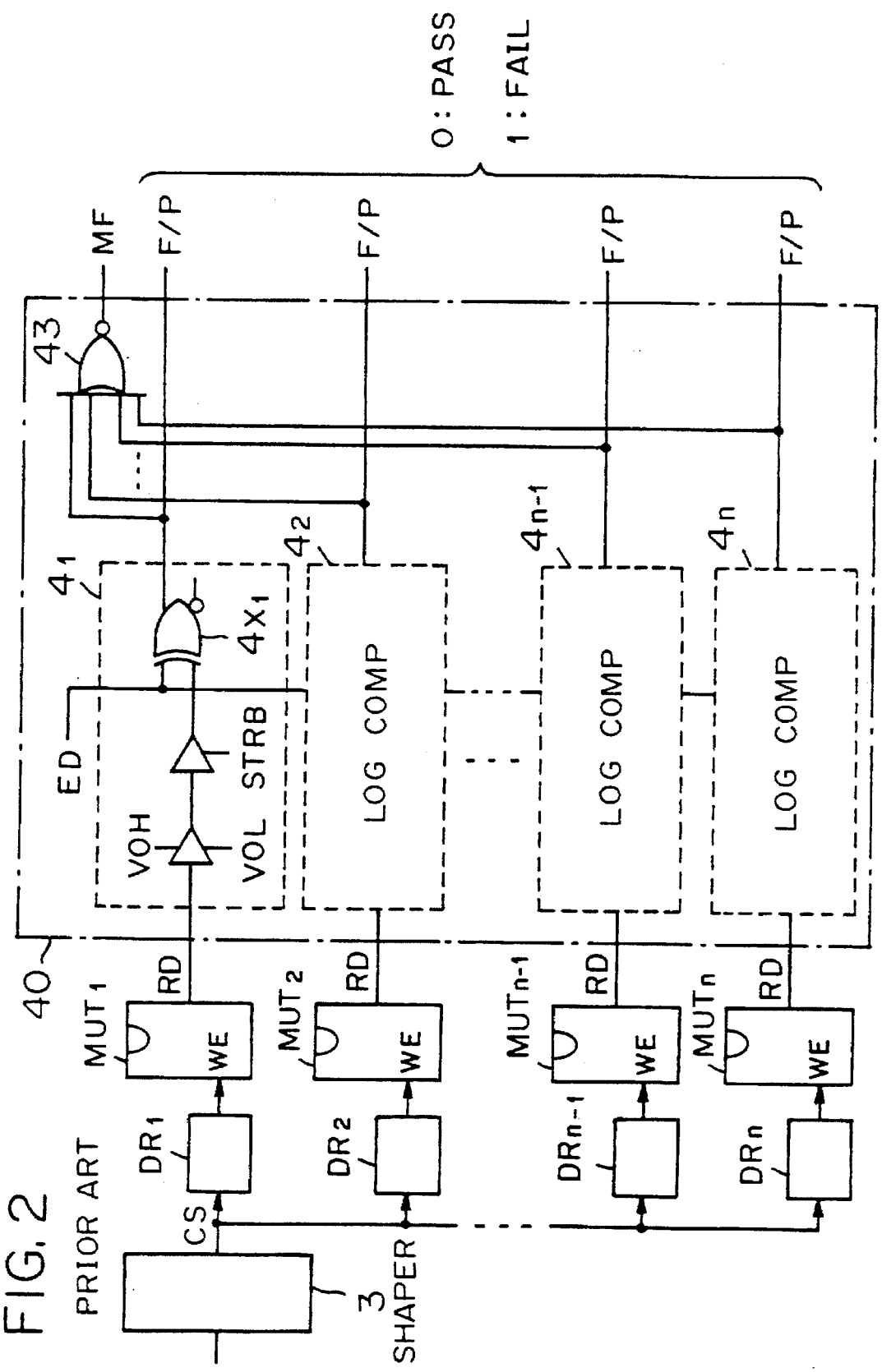
FIG. 2 is a block diagram showing the construction of a logical comparing part 40 shown in FIG. 1.

The logical comparators $4_1$, $4_2$, ... $4_n$ in the logical comparing part 40 are of the same circuit construction. A typical example thereof is shown only in block $4_1$. The logical comparator $4_1$ comprises a compared result inhibition gate $45_1$ and a write completion register $42_1$. The compared result inhibition gate $45_1$ is connected to a non-inverted output of the disaccord detecting circuit $4X_1$ shown in FIG. 2. The write completion register $42_1$ is constructed of s D type flipflop. A clock terminal of the write completion register $42_1$ is connected to an inverted output of the logical comparator $4X_1$. The register $42_1$ outputs a compared result inhibition signal $INH_{CM}$ and a write enable inhibition signal $INH_{WE}$ from an output Q to another input of the inhibition gate $45_1$ and an invertedinput terminal of the write enable inhibition gate $44_1$, respectively. The logical compared result inhibition gate $45_1$ outputs a compared result of the logical comparator $4_1$. For simplicity, FIG. 3 does not show a level comparator that is disposed on the input side of the disaccord detecting circuit $4X_1$ and performs logical determination and a sample hold circuit that holds the logically determined result at the timing of the strobe signal STRB. In addition, FIG. 3 does not show connections of address pattern data and test pattern data.

The write completion registers $42_1$, $42_2$, ..., each of which is constructed of a D-type flipflop, become "H" with a match or accord detecting signal WC. The match detecting signal WC represents that the write operation is completed and is received from the disaccord detecting circuit 4X. When the write enable inhibition signal $INH_{WE}$ which is generated by the write completion register $42_1$, is supplied to the inverted input of the write enable inhibition gate $44_1$ and a clear signal CLS that is generated just before an address is updated is supplied to the write completion register $42_1$, the write completion register $42_1$ is reset. Thus, the write enable inhibition gates $44_1$, $44_2$, ... $44_n$ are normally open. When the write completion signal WC is generated, the write enable inhibition gates $44_1$, $44_2$, ... $44_n$ are closed. In addition, just before an address is updated, the write enable inhibition gates $44_1$, $44_2$, ... $44_n$ are opened again.

When the write operation is completed, the write enable inhibition gates $44_1$, $44_2$, ... $44_n$ are closed. Thus, after the write operation is completed at a designated address, further write operation can be inhibited at the address.

A read command that verifies whether or not data was correctly written to a flash memory is referred to as program verify unlike with a simple read operation of the memory. In addition to the program verify command, every command that defines the operation of the flash memory is set in the memory by a write enable signal. Thus, when the inhibition gate $44_1$ is closed against a test memory where write operation is completed (for example, $MUT_1$), the program verify command cannot be set to the memory $MUT_1$. Thus, the read operation is not performed for the memory $MUT_1$. Thus, the mismatch detecting circuit $4X_1$ again outputs FAIL ("1"), which represents mismatch. However, according to the first embodiment of the present invention, after the data write operation is completed (namely, WC becomes "1"), since the output Q of the flipflop $42_1$ becomes "1", the gate $45_1$ is closed, thereby inhibiting the logically compared result from being output. As a result, the PASS status ("0") is forcedly set. In this embodiment, the register $42_1$ and the gate $45_1$ are disposed in the logical comparator $4_1$, However, the register $42_1$ and the gate $45_1$ may be disposed outside the logical comparator $4_1$.

The write enable inhibition gates $44_1$ to $44_n$ are constructed of AND gates. The write enable signal WE is input to the flash memories $MUT_1$ to $MUT_n$ through the AND gates $44_1$ to $44_n$, respectively. The read data RD of each flash memory MUT is held in the logical comparators $4_1$ to $4_n$ at the timing of the strobe signal STRB and compared with the expected data ED by the XOR gate 4X, which constructs the mismatch detector. The compared result register 42 is constructed of a Dtype flipflop. Inhibition data H in H level is always supplied to the register 42. In addition, a clock that is an inverted output of the XOR gate 4X is supplied to the register 42. The XOR gate 4X outputs the compared result to the compared result inhibition gate 45, which is constructed of an AND gate. In addition, an inverted signal of the output Q of the register 42 is supplied to the compared result inhibition gate 45. In addition, an inverted output of the output Q of the register 42 is supplied to the other input terminal of the AND gate 44. The allpass detector 43 is constructed of an NOR gate. An output of the XOR gate $4X_1$, which is the compared result of the test memory MUT, is supplied to the allpass detector 43 through the AND gate $45_1$.

Next, with reference to the timing charts shown in FIGS. 4A–N, the operation of the first embodiment shown in FIG. 3 will be described. Just before an address is generated, the pattern generator 2 generates a clear signal CLR so as to reset the write completion registers $42_1$, $42_2$, ... $42_n$. Next, the pattern generator 2 generates an address AO and write enable signals WE1, WE2, ... therefor. These write enable signals are supplied to the test memories $MUT_1$, $MUT_2$, ... $MUT_n$ through the inhibition gates $44_1$, $44_2$, ..., respectively. The write enable signal is supplied to the test memory $MUT_1$ three times. In other words, the write operation is preformed for the test memory MUT1 three times. FIG. 3 shows the case that the read data matches with the expected data ED. When the match output "1" is supplied to the inverted output of the mismatch detecting circuit $4X_1$, the match output, which is the write completion signal WC, is supplied to the write completion register $42_1$ so that the signal level H ("1") of the data terminal is set to the flipflop. The signal level "1", which is the write enable inhibition signal $INH_{WE}$, of the output Q of the write completion register $42_1$ is supplied to the inhibition gate $44_1$. Thus, the inhibition gate $44_1$ is closed. In addition, the logically compared result inhibition signal $INH_{CM}$ is supplied to the logically compared result inhibition gate $45_1$. Consequently, the logically compared result inhibition gate $45_1$ is closed. As a result, the output of the gate $45_1$ is kept to "0", which represents PASS, until the flipflop $42_1$ is reset by the clear signal CLR. Thus, write enable signals WE4, ... that follow are inhibited from being supplied to the test memory $MUT_1$. Consequently, further write operation is not performed for the address 0.

Now assume that when the write operation is performed four times, data is successfully written to the test memory $MUT_2$ and other test memories (not shown). When the write operation is performed with the third write enable signal WE3, if the read data RD of the $MUT_2$ disaccordes with the expected data ED, "1" is not set to the register $42_2$. Thus, the AND gate $45_2$ allows the logically compared result "1", which represents disaccord (FAIL), to pass. At this point, the AND gate $44_2$ does not inhibit the write enable signal. The FAIL signal "1" that passes through the AND gate $45_2$ is supplied to the NOR gate 43. Thus, regardless of the logically compared results of other test memories, the output MF of the NOR gate 43 becomes "1". When MF=1, the pattern generator 2 determines that the flash memory $MUT_2$ has failed in the write operation. The pattern generator 2 performs the data write test for the same address A0.

In this case, in the logical comparator 41 for the flash memory $MUT_1$ that has passed, "1" is set to the register $42_1$. The signal level "1", which is the write enable inhibition signal, is input to the AND gate $44_1$. Thus, data is not written to the flash memory $MUT_1$. Consequently, the write operation is prevented from being excessively performed at this address of the flash memory $MUT_1$. In addition, since the write enable signal is not supplied to the flash memory $MUT_1$, the program verify command is not set. Thus, data is not read for the verify operation. Consequently, although the data RD does not match with the expected data ED, the logically compared inhibition signal is still supplied from the register $42_1$ to the AND gate $45_1$. Thus, the logically compared result is not output from the AND gate $45_1$, thereby representing PASS ("0").

Likewise, other flash memories MUT that have passed the write test are prevented from being excessively written. When the write operation is performed for the same address a predetermined number of times, if the match flag MF, which represents all memories have passed the write test for the address, is not obtained, the pattern generator 2 writes all F/P statuses of the memories to corresponding addresses of the fail analyzing memories 5, clears the registers $42_1$ to $42_n$, updates the present address to the next address, and continues the test.

When all the flash memories have passed the write test, the outputs of all the AND gates $45_1$ to $45_n$ become "0". Thus, the output MF of the NOR gate 43 becomes "1". When the pattern generator 2 updates the present address to the next address corresponding to the match flag MF, before the write test is performed for the selected address of the flash memories MUT, the contents of all the registers $42_1$ to $42_n$ are cleared with the clear signal CLR and then the write test is continued.

In the first embodiment shown in FIG. 3, the write enable signals are inhibited from being supplied to the test memories $MUT_1$, $MUT_2$, ... $MUT_n$. Instead, chip select signals may be inhibited from being supplied to chip select terminals of these memories. The chip select terminals are disposed in semiconductor IC devices so as to turn on and off the power supplied to these semiconductor IC devices. With these chip select signals, the devices can be enabled and disabled.

(Second Embodiment)

Figure 4:
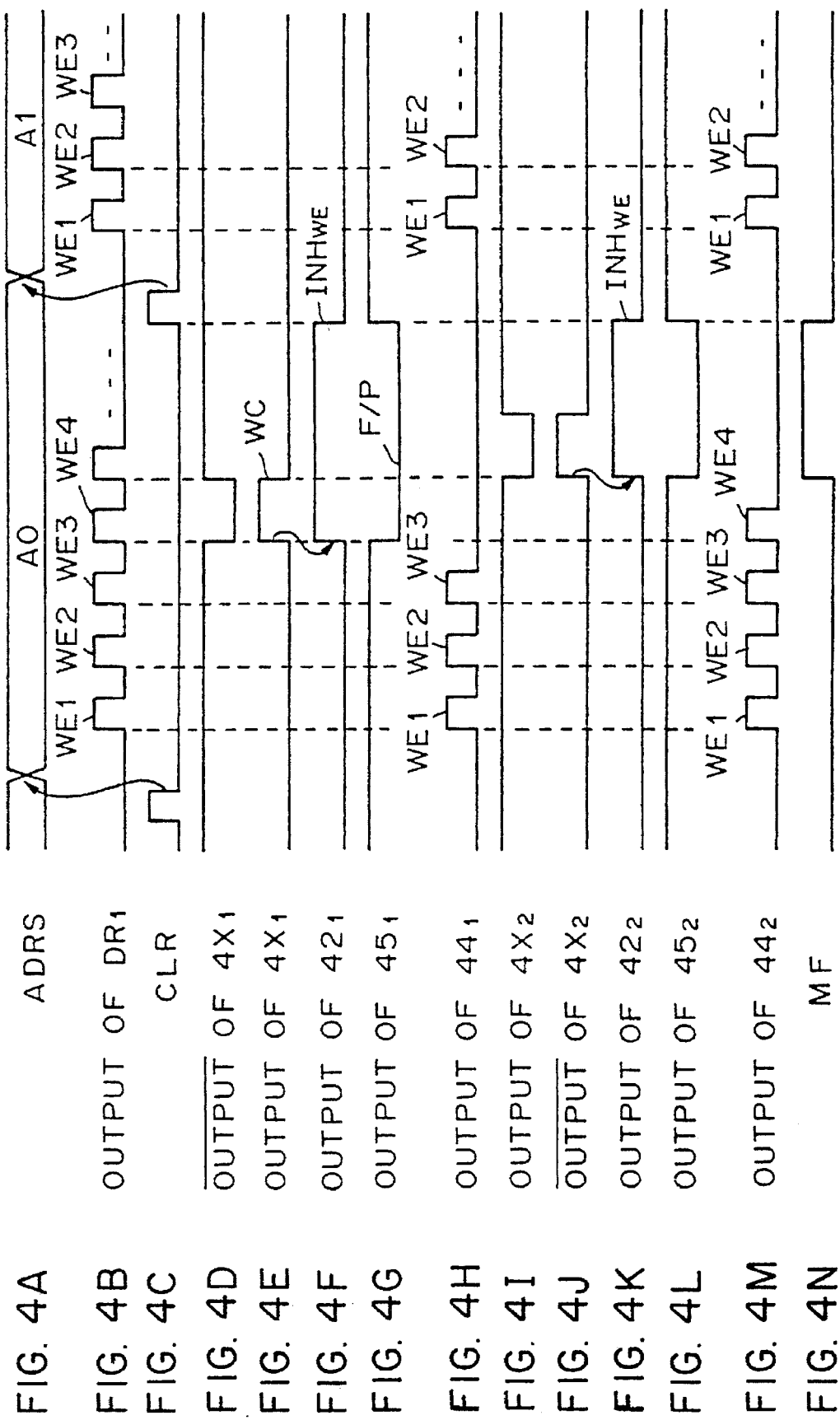
FIGS. 4A–N are timing charts for explaining the operation of the first embodiment shown in FIG. 3
Figure 5:
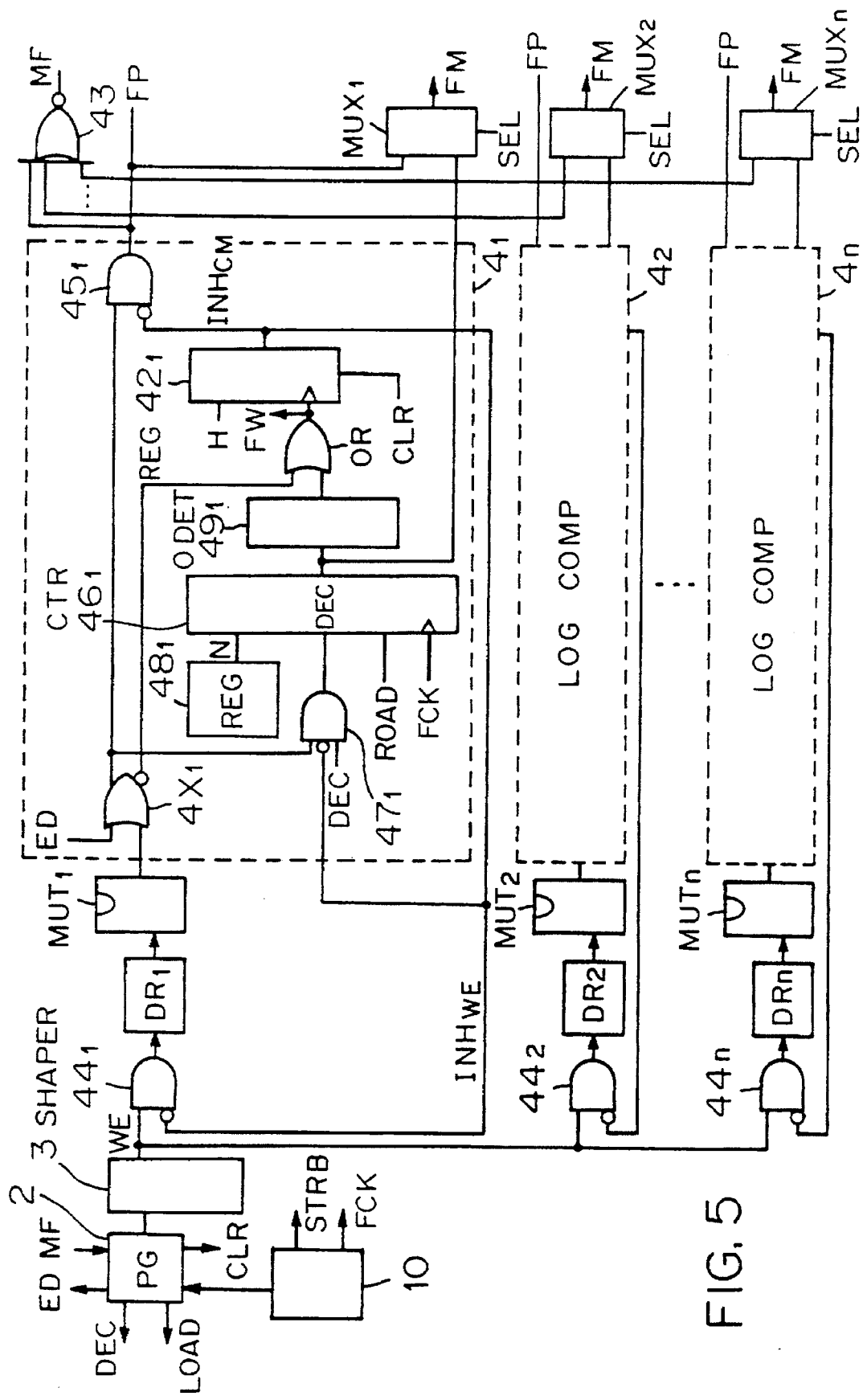
FIG. 5 is a block diagram showing an apparatus according to a second embodiment of the present invention.

Next, with reference to FIG. 5, a second embodiment of the present invention will be described. Since the write operation for each of the test memories $MUT_1$ to $MUT_n$ is the same, for simplicity, only the test memory $MUT_1$ will be described. In addition, the suffixes representing the constructional parts of the test memory $MUT_1$ are omitted. The difference between the first embodiment shown in FIG. 3 and the second embodiment shown in FIG. 4 is in that a counter 46, a second register 48, and a zero detector 49 are additionally provided and that when disaccord is detected a predetermined number of times, a write enable inhibition signal $INH_{WE}$ and a logically compared result inhibition signal $INH_{CM}$ are output. The counter 46 is normally in hold state. While the signal level of the DEC terminal is "1", a clock FCK that synchronizes with a write enable signal WE is decrementally counted.

Whenever the clear signal CLR is generated, with a LOAD command that is a control signal generated by the pattern generator 2, a predetermined number of times N of the write test is loaded from the register 48 to the counter 46. After the LOAD command is generated, the pattern generator 2 causes a decremental command DEC to become H level, thereby opening the AND gate 47 and decrementing the value of the counter 46 with the clock FCK upon occurrence of a fail signal (mismatch signal) "1" that is output from the XOR gate 4X. When the number of times of the write operation that has failed at the same address of the test memory MUT matches with the loaded value N, the value of the counter 46 becomes "0". The zero detecting circuit 49 detects the signal level "0" and outputs signal level "1". In the test mode where the test result FAIL is recorded in the fail analyzing memory 5 (see FIG. 1), the zero detected output "1", which is a write command FW, is supplied to a circuit corresponding to the fail analyzing memory 5. The mismatch output of the mismatch detecting circuit 4X1 is written to the fail analyzing memory 5 through the gate 45. The zero detected output, which is a clock, is supplied to the register 42. Thus, "H" is set to the register 42. Consequently, Just after the logically compared result is written to the fail analyzing memory 5, both the inhibition gate 45 and the AND gate 47 are closed. In addition, the inhibition gate 44 inhibits the write enable signal WE from being supplied to the flash memory MUT.

When the counter 46 counts the number of mismatch times N and thereby the gate 45 is closed, the outputs of all the logical comparators $4_1$ to $4_n$ become "0". Thus, the output of the NOR gate 43 becomes "1". Consequently, the pattern generator 2 does not need to count the number of occurrences of the write enable signal WE. Whenever the signal level of the signal MF becomes "1", the clear signal CLR is generated and the command LOAD is supplied to the counter 46, thereby updating the address. While the value N set to the counter 46 is decremented to "0", if the XOR gate 4X outputs PASS ("0"), the inverted output thereof (namely, "1"), which is a clock, is supplied to the register 42 through the OR gate. Thus, the same operation as the first embodiment shown in FIG. 3 is performed.

Figure 1:
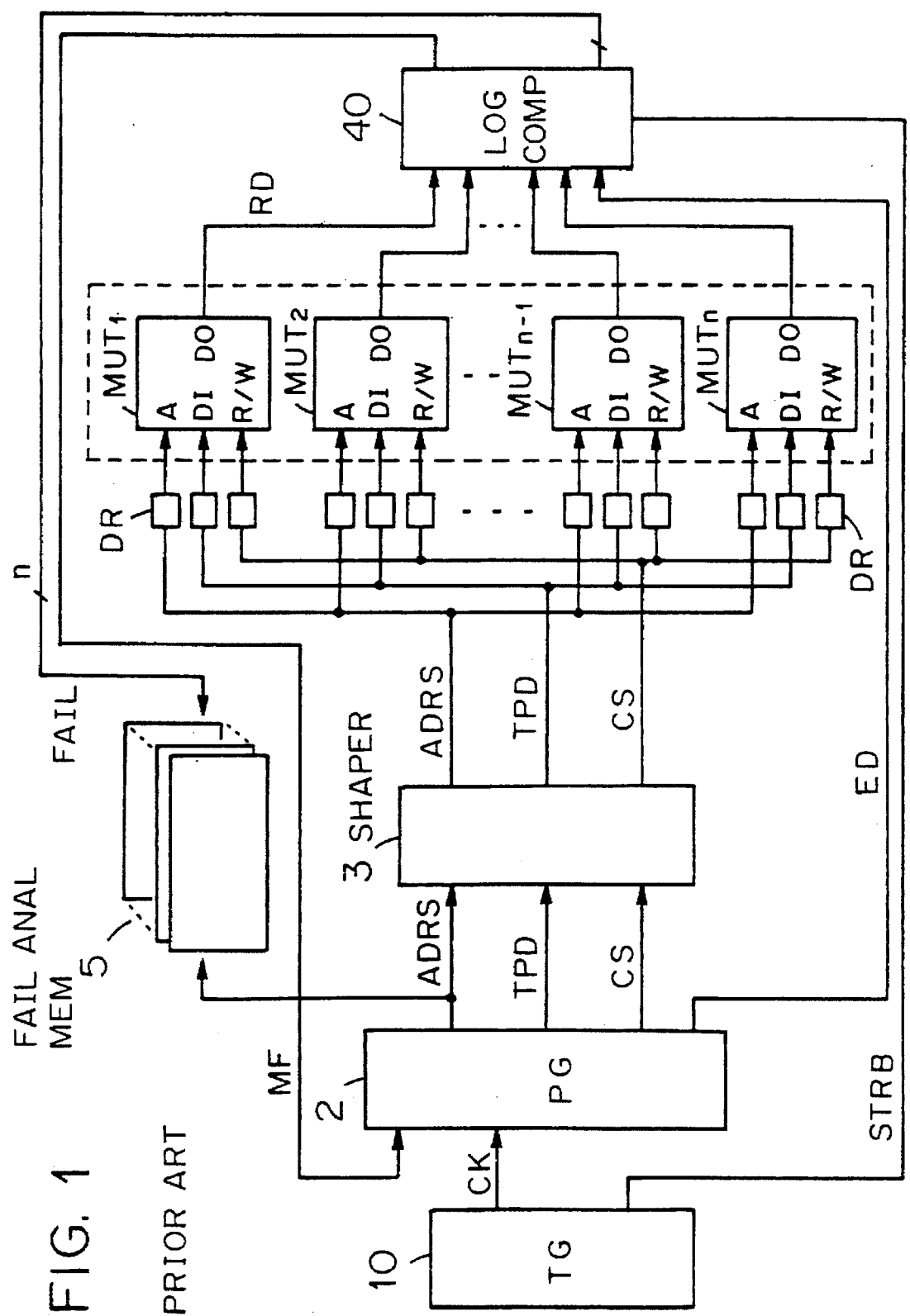
FIG. 1 is a block diagram showing an example of a conventional semiconductor memory test apparatus.

In the fail memory function (AFM) of the semiconductor test apparatus shown in FIG. 1, only when a fail is detected at each address, fail information is written to a corresponding address of the fail memory. On the other hand, when fail analysis is performed for a memory device such as a flash memory where write operation is performed several times until data is successfully written at each address, information representing the number of times of the write operation performed until passed for a memory cell of each address is required. In the second embodiment shown in FIG. 5, multiplxers $MUX_1$ to $MUX_n$ may be disposed on the test channels so as to selectively output the logically compared result output of the logical comparator 4 and the output of the counter 46 with a selection signal SEL.

When the address is updated, the content of the register 42 is cleared, the content of the register 48 is loaded to the counter 46, and the abovedescribed steps are repeated. If the test memory has passed before the write operation is performed the number of times N, the number of times of the write operation executed so far, that is M, is stored in the counter 46. Thus, the value M is stored at a predetermined address of a circuit corresponding to the fail analyzing memory 5 (see FIG. 1), which is disposed on each channel, instead of the fail data. After the write test, the value M can be used for analyzing the test memory. In a modification of the second embodiment, the register 48 is omitted and the counter 46 is an incremental counter that counts from "0". In this modification, a match detector that determines whether the value of the counter 46 matches with a set value is provided instead of the zero detector 49. In this case, when the write test is completed, the counter 46 stores the value M, which represents the number of times of the write operation performed until the test memory passes.

(Third Embodiment)

Figure 6:
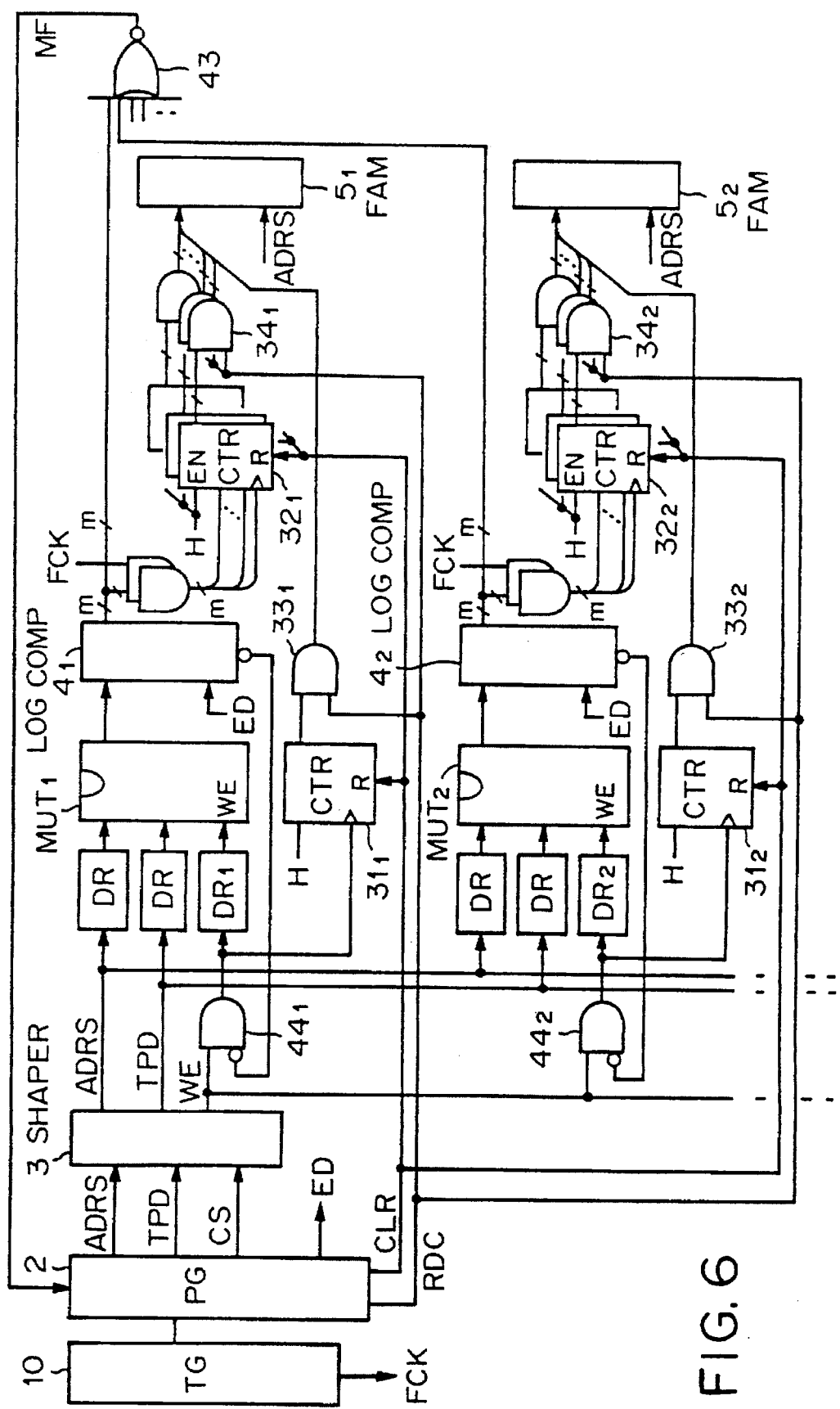
FIG. 6 is a block diagram showing the construction of an apparatus for obtaining a determined history according to a third embodiment of the present invention.

FIG. 6 shows a third embodiment of the present invention. In the third embodiment, analyzing counters $32_1$, $32_2$, ... $32_n$ are provided corresponding to the number of data bits. M bits of a compared output of the logical comparator $4_1$ of a first test channel are supplied to first input terminals of m AND gates 32A. Outputs of m AND gates 32A are supplied to corresponding clock terminals of m counters $31_1$. The signal level of an enable signal terminal of the counter $31_1$ is always "H". Just before the write test is performed, a clear signal CLR is supplied from a pattern generator 2 to a reset terminal of the counter $3_1$. A clock FCK that synchronizes with a write enable signal WE is supplied to second input terminals of the m AND gates 32A. The AND gate 32A corresponding to bit "1" of the m bits supplied from the logical comparator $4_1$ is opened. A corresponding counter $32_1$ counts the clock FCK. An output of the counter $32_1$ is supplied to an AND gate $34_1$. Just before the clear signal CLR is generated for each address, with a read command RDC supplied from the pattern generator 2, the AND gate $34_1$ is opened. The value of the counter $32_1$ is loaded to a ocrresponding address of a fail memory $5_1$. This construction applies to other channels of the test memories. Analyzing counters $32_1, 32_2, \ldots 32_n$ store the number of times of the write operation that has failed for each bit of the test memories $MUT_1, MUT_2, \ldots MUT_n$.

If necessary, write times counters $31_1, 31_2, \ldots$ may be provided. A write enable signal WE generated by the waveform shaper 3 is supplied to trigger terminals of the counters $31_1, 31_2, \ldots 31_n$ through write enable inhibition gates $44_1, 44_2, \ldots$ By counting the number of occurrences of the write enable signal WE, the number of times of the write operation for each address can be counted. The signal level of the input terminals of the counters $31_1, 31_2, \ldots 31_n$ is "H". The clear signal CLR generated by the pattern generator 2 is supplied to reset terminals of the counters $31_1, 31_2, \ldots$ The values of the counters $31_1, 31_2, \ldots$ are loaded to corresponding addresses of the fail memories $5_1, 5_2, \ldots 5_n$ through AND gate circuits $33_1, 33_2, \ldots 33_n$ that are opened by the read command RDC.

The write times counters $31_1, 31_2, \ldots 31_n$ and the analyzing counters $32_1, 32_2, \ldots 32_n$ may be constructed of memories. In this case, as address information of the counter memories, different addresses are set corresponding to the maximum number of times of write operation for each address of the test memory. As write information, fail signals of the logical comparators $4_1, 4_2, \ldots 4_n$ are supplied. Thus, the pass/fail history for each write operation can be written and read.

Figure 7:
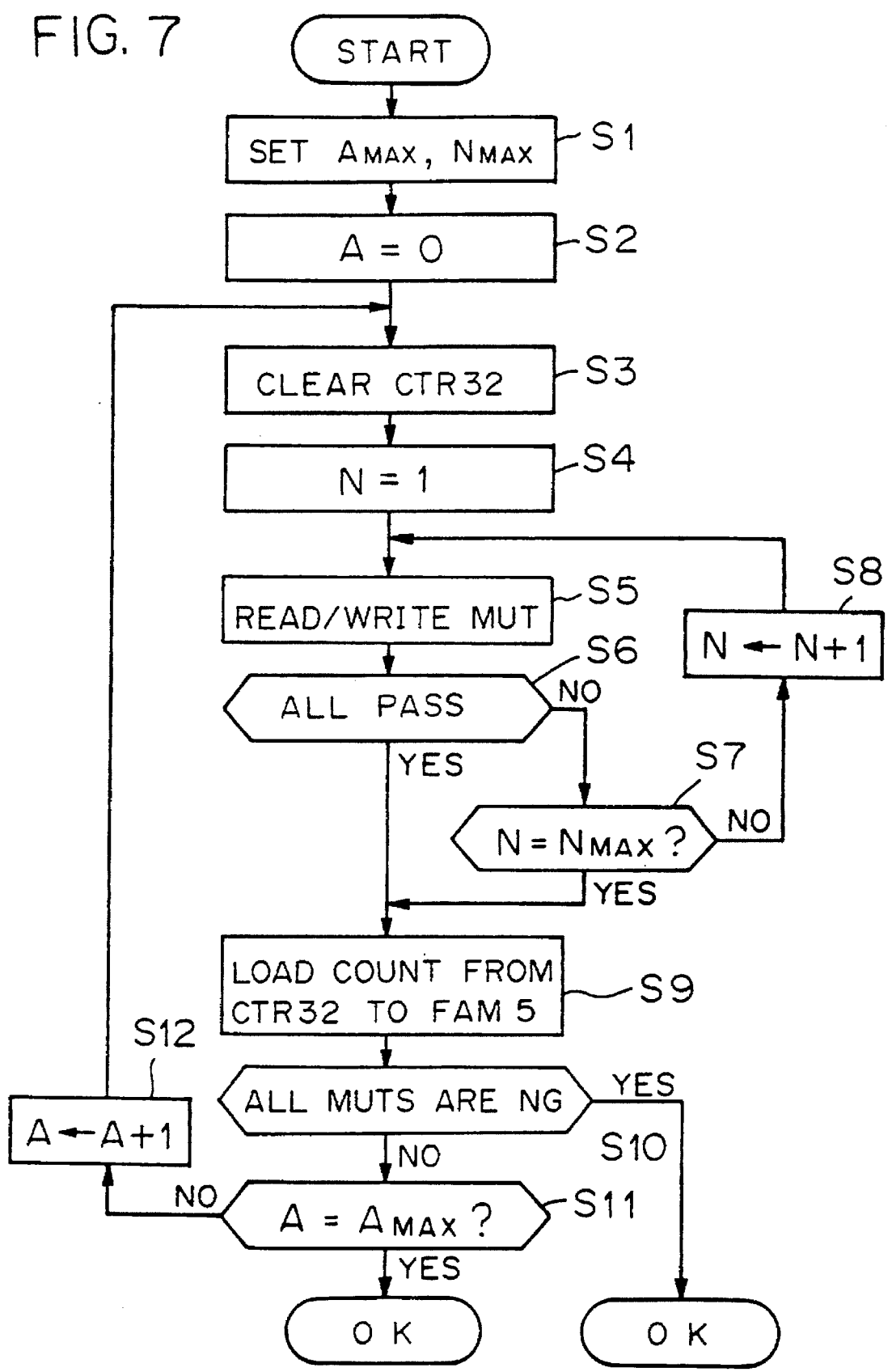
FIG. 7 is a flow chart for explaining the operation of the third embodiment shown in FIG. 6.

FIG. 7 is a flow chart showing the process of an analyzing counter 32 for counting the number of times of write operation that has failed for each address of a test memory. At step S1, a maximum address $A_{MAX}$ nd a maximum number of valid write times $N_{MAX}$ are set for a test memory MUT. At step S2, an address A is set to an initial address 0. At step S3, the analyzing counter 32 is cleared.

Next, at step S4, the number of write times N is set to 1. At step S5, test pattern data TPD is written to the test memory MUT and then the test pattern data TPD is read therefrom. At step S6, it is determined whether or not all bits of the data read at step S6 match with corresponding bits of the expected data. When the determined result is YES at step S6, since the write operation for the address A is completed, the flow advances to step S9. When the determined result is NO at step S6, the flow advances to step S7. At step S7, it is determined whether or not the number of present write times N is equal to the number of maximum valid write times $N_{MAX}$. When the determined result is NO at step S7, the flow advances to step S8. At step S8, the number of write times N is incremented by "1". The flow returns to step S5. At step S5, the write test is repeated. At step S7, when the determined result is YES at step S7, the flow advances to step S9.

At step S9, the read command RDC is supplied to the AND gate circuit 34. Thus, the AND gate circuit 34 is opened. Consequently, the value of the counter 32 is loaded to a corresponding address of the fail memory 5. Thus, the number of times of the write operation that has failed at the address A of the test memory is obtained for each output pin (each data bit).

At step S10, when a plurality of test memories are tested, it is determined whether or not all the memories have failed. When the determined result is YES at step S10, the test is forcedly terminated.

At step S11, it is determined whether or not the address A of the test memory is equal to the upper limit $A_{MAX}$. When the determined result is NO at step S11, the flow advances to step S12. At step S12, the address is incremented by "1" (A=A+1). The flow returns to step S3. At step S3, the test is continued. When the determined result is YES at step S11, the test is completed.

Whenever the write test is performed for each address of the test memory, the value of the analyzing counter 32 is read. Thus, it can be determined how many times the write operation has failed at what bit and/or memory. In the above example, the analyzing counter 32 was described. However, along with the analyzing counter 32, the write times counter 31 may be used.

At step S9, instead of loading the value of the counter 32 to the fail memory 5, the value may be written to a corresponding address of a memory of a CPU (not shown) in the pattern generator.

Figure 8:
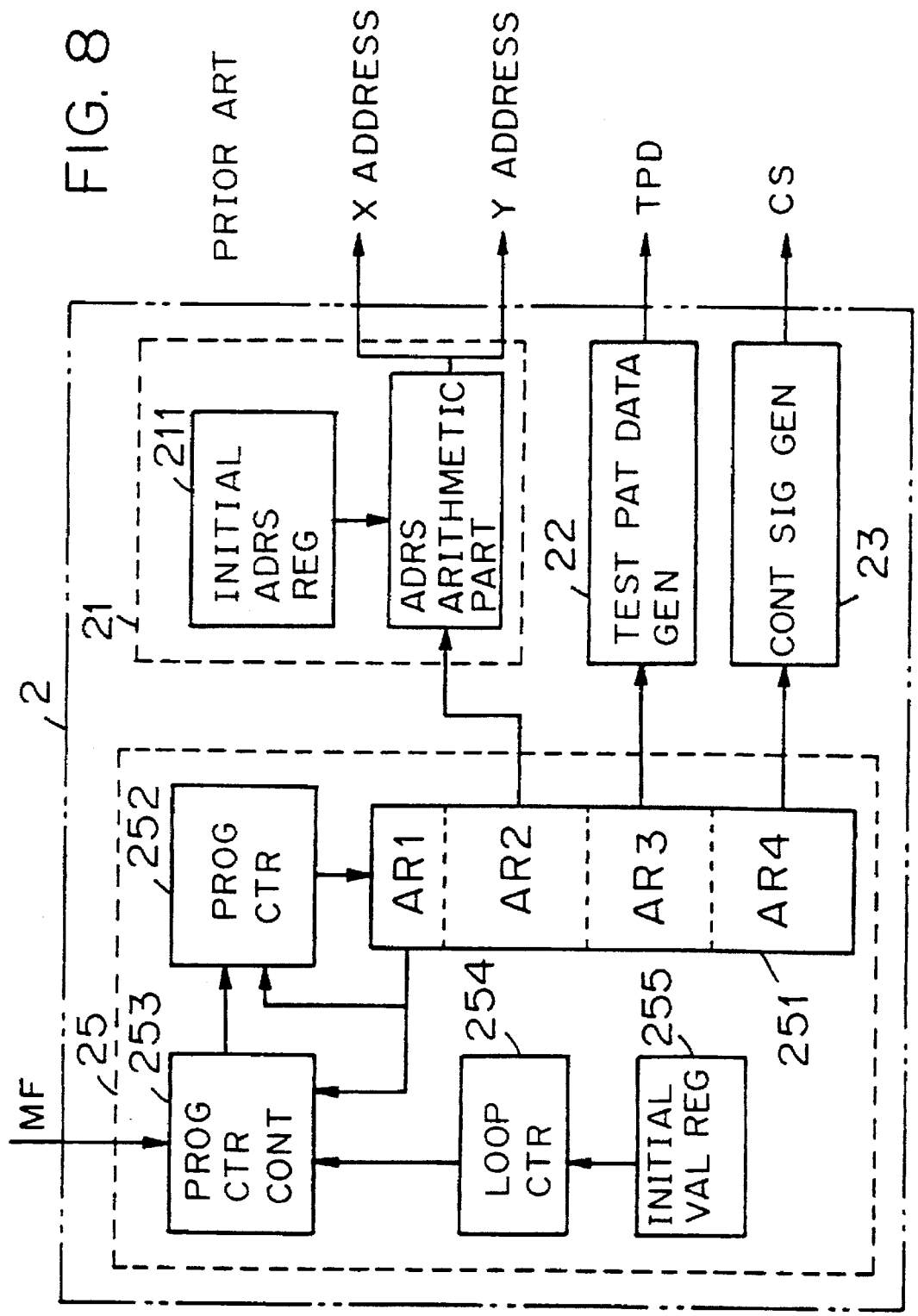
FIG. 8 is a block diagram showing the construction of a conventional pattern generator shown in FIG. 1.

The test pattern generator 2 in the conventional semiconductor test apparatus shown in FIG. 1 is constructed for example as shown in FIG. 8. The test pattern generator 2 comprises an address generating part 21, a test pattern data generating part 22, a control signal generating part 23, and a sequence control part 25. The sequence control part 25 controls the operations of the address generating part 21, the test pattern data generating part 22, and the control signal generating part 23.

The sequence control part 25 comprises an instruction memory 251, a program counter 252, a program counter controller 253, a loop counter 254, and an initial value storing register 255. The instruction memory 251 stores a sequence of commands that generates test pattern data. The program counter 252 designates an address of the memory 251. The program counter controller 253 controls the counter 252 ocrresponding to the commands stored in the memory 251. The loop counter 254 is used when a loop command is issued. The initial value storing register 255 stores an initial value of the loop counter. The instruction memory 251 has a sequence control command area AR1, an address arithmetic command area AR2, a data arithmetic command area AR3, and a control signal generation command area AR4.

The instruction memory 251 is accessed with an address that is output from the program counter 252. The contents of the areas AR1 to AR4 ocrresponding to the address position being accessed are supplied to the program counter controller 253, the address generating part 21, the test pattern data generating part 22, and the control signal generating part 23. The program counter controller 253 decodes the sequence control command of the area AR1, increments or holds the program counter 252, or loads the address so as to generate a new address and execute the sequence of commands. When the sequence control command is a loop command, the number of times of generation of addresses supplied from the register 255 is loaded to the loop counter 254. Until the value of the counter 254 becomes "0", whenever the loop is executed, the value of the loop counter 254 is decremented by "1". The address generating part 21 comprises an initial address storing register 211 and an address arithmetic part 212. The address generating part 21 performs an arithmetic operation corresponding to a signal received from the area AR2 of the instruction memory 251 so as to generate X address and Y address.

As described above, due to the construction of the flash memory, data write operation should be performed several times rather than once. The number of times X of the data write operation performed until data is successfully written depends on the type of the test memory MUT. In addition, even if the same type of test memory MUT is used, the number of times X depends on each address. In the data write test of the flash memory, when data can be written to all memory cells within the predetermined number of times $X_{MAX}$, it is determined that this memory is good. This applied to the data erase test. In other words, when data can be erased from all the required memory cells within the predetermined number of times, it is determined that the memory is good.

Figure 9:
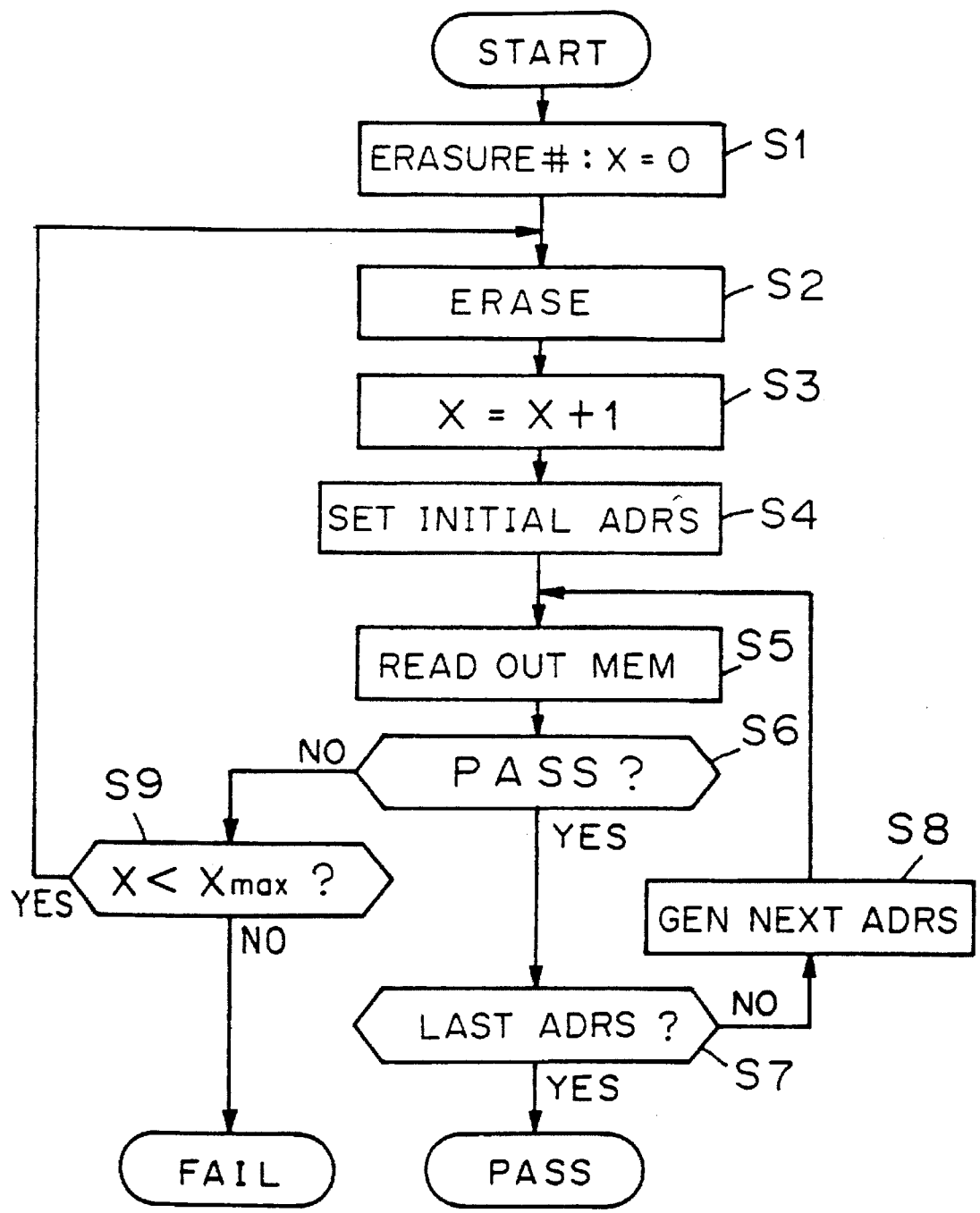
FIG. 9 is a flow chart showing the operation of an erase test of a flash memory of a conventional memory test apparatus.

In the data erase test of the flash memory, the content of the memory is erased at the same time or block by block. Next, with reference to a flow chart shown in FIG. 9, an example of an erase test for erasing a plurality of flash memories in parallel at the same time will be described.

At step S1, the number of erase times X is set to an initial value "0". At step S2, the content of each of the test flash memories $MUT_1$ to $MUT_n$ are erased in parallel at the same time or block by block. At step S3, the number of erase times X is incremented by "1". At step S4, a first address of a region to be erased is designated. At step S5, data is read from the designated address of the test memory. At step S6, it is determined whether or not the compared results that are output from all the logical comparators $4_1$ to $4_n$, (see FIG. 2) have passed (namely, MF=1). When the determined result is YES (PASS) (namely, the match flag MF=1 is supplied to the program counter controller 253) at step S6, the flow advances to step S7. At step S7, it is determined whether or not the present address is equal to the last address. When the determined result is NO at step S7, the flow advances to step S8. At step S8, the next address is designated. The flow returns to step S5. At step S5, the read operation is performed at the designated address. When the determined result is YES at step S6, the present address is updated unless the present address is not the last address. When the determined result is YES at step S7, it is determined that the entire flash memory or a block thereof is passed. At step S6, when one of the determined results of the read data is FAIL (MF=0), the flow advances to step S9. At step S9, it is determined that the number of erase times X is less than the predetermined value Xmax. The flow returns to step S2. At step S2, the erase operation is repeated. At step S3, the number of erase times X is increased by "1". After the allerase operation is completed, at steps S4 to S8, read data is determined and address is updated from the initial value of the address as long as MF=1 is detected. At step S6, if MF=0 is detected, the erase test sequence is further executed at steps S2 to S6. As long as FAIL takes place at any address, until the erase test sequence is continued the number of predetermined times $X_{max}$. When the erase test sequence is continued the number of predetermined times $X_{max}$, it is determined that all the flash memory MUT or the block thereof is FAIL.

When the determined result is YES at step S6, the next address is designated. When the determined result is NO at step S6, the erase operation is performed. In other words, a pattern supplied to the memory MUT depends on the determined result of the designated address. The determined result (MF=0 or 1) is input to the test pattern generator 2. Since the pattern generated by the test pattern generator 2 depends on the input of the determined result, the wait time becomes long.

When the determined result at a particular address of a sequence of addresses has been FAIL, even if there are addresses that have been determined PASS in the preceding erase operation, all the sequence of addresses are tested from the beginning. Thus, the test time becomes long. This is because the addresses that have been determined PASS are redundantly tested.

(Fourth Embodiment)

Figure 10:
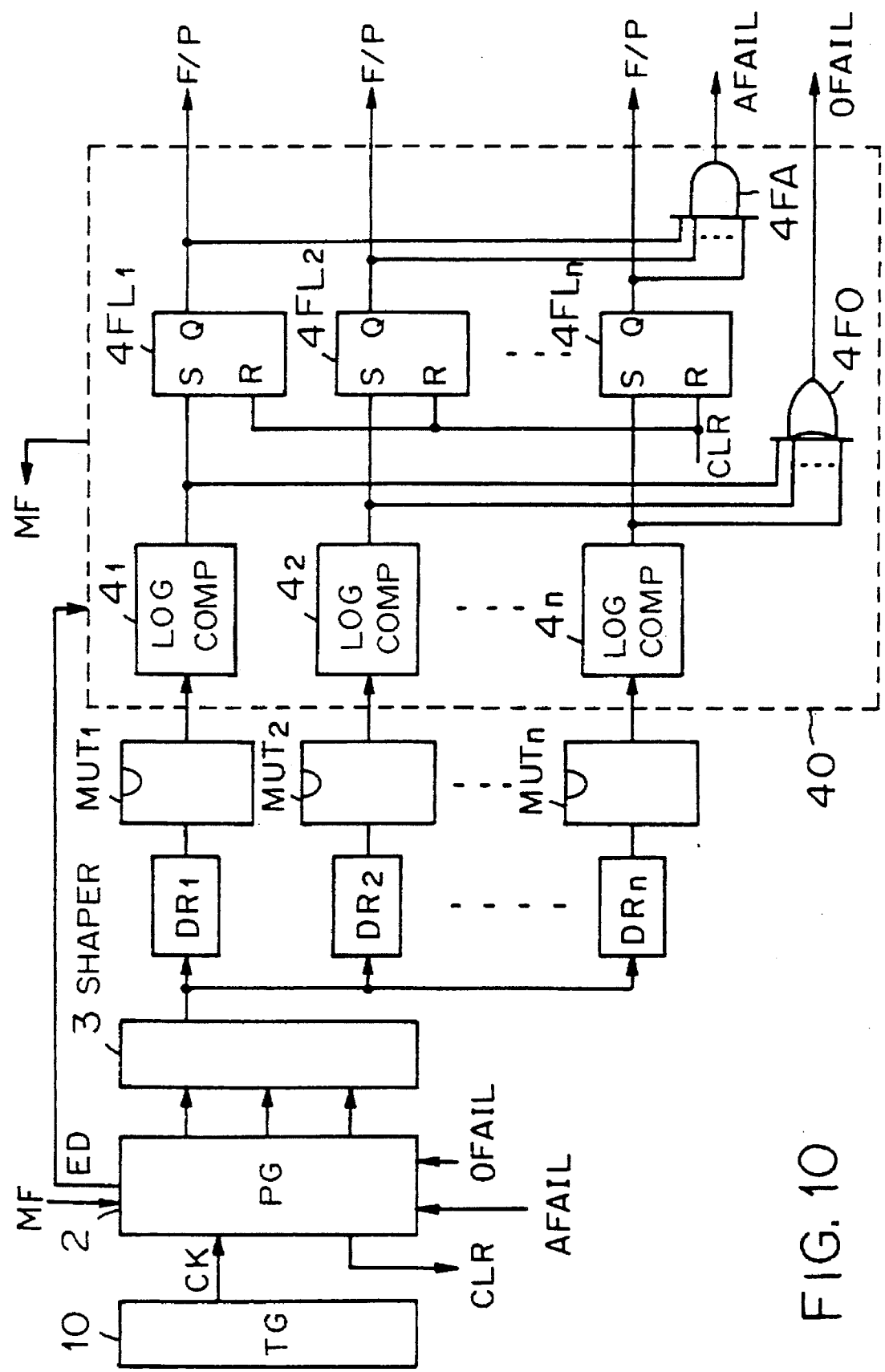
FIG. 10 is a block diagram showing the construction of an apparatus for performing allerase test according to a fourth embodiment of the present invention.

FIG. 10 shows the construction of an apparatus according to a fourth embodiment of the present invention. The construction of the apparatus of the forth embodiment is the same as the construction of the conventional apparatus shown in FIG. 1 except that the time necessary for the erase test is reduced. In FIG. 10, for simplicity, the same parts as these shown in FIG. 10 are denoted by the same reference numerals thereof. In the fourth embodiment, the logical comparing part 40 further comprises flipflops $4FL_1$ to $4FL_n$, an OR gate 4FO, and an AND gate 4FA. The flipflop $4FL_1$ to $4FL_n$ hold output fail signals FAIL of the logical comparator $4_1$ to $4_n$, respectively. The OR gate 4OF detects that at least one of test memories MUT is FAIL (the output of the OR gate 4FO is OFAIL). The AND gate 4FA detects that the outputs of the flipflops $4FL_1$ to $4FL_n$ for all the test memories MUT are FAIL (the output of the AND gate 4FA is AFAIL). The flipflops $4FL_1$ to $4FL_n$ are set by the FAIL outputs of the logical comparators $4_1$ to $4_n$, respectively. The outputs Q of the logical comparators $4_1$ to $4_n$ are supplied to the AND gate 4FA. The AND gate 4FA outputs the AFAIL signal. When the allerase operation is performed, the clear signal CLR is supplied from the pattern generator 2 to the flipflops $4FL_1$ to $4FL_n$, thereby resetting the flipflops $4FL_1$ to $4FL_n$.

Figure 11:
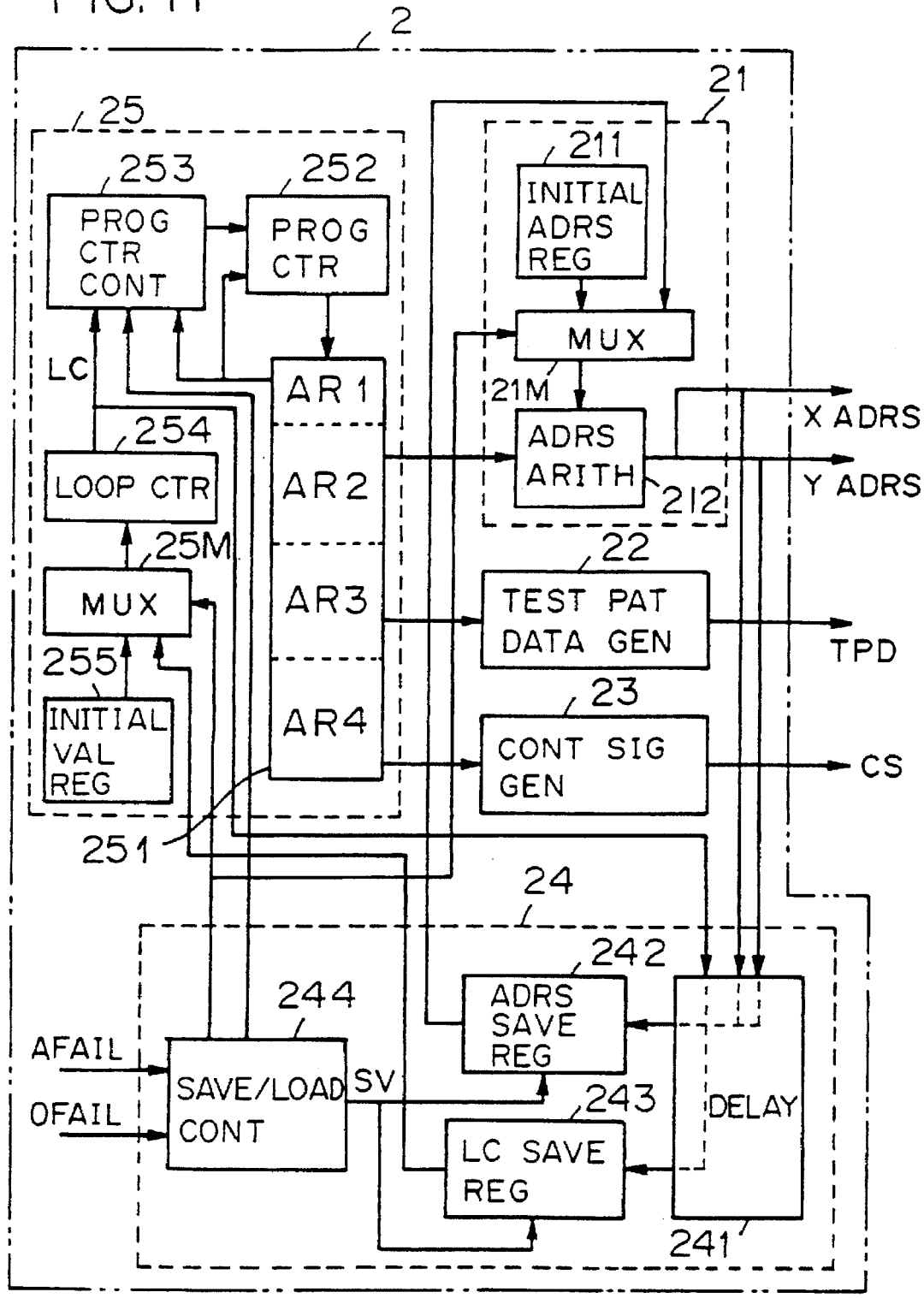
FIG. 11 is a block diagram showing the construction of a pattern generator shown in FIG. 10.

As shown in FIG. 11, the pattern generator 2 has a bus address detecting part 24 that is not used in the construction shown in FIG. 8. The bus address detecting part 24 comprises a delay part 241, an address save register 242, a loop counter save register 243, and a save/load control part 244. The delay part 241 delays both the address generated by the address generating part 21 and the loop count value of the loop counter 254 for a predetermined time of period. When the save/load control part 244 detected a first PASS (OFAIL=1 and AFAIL=0), the address save register 242 and the loop counter save register 243 store the address ADRS and the loop count value LC, respectively. The save/load control part 244 causes the registers 242 and 243 to store the delayed address and the delayed loop count value corresponding to the OFAIL signal, respectively. The address generating part 21 and the sequence control part 25 have multiplexers 21M and 25M, respectively. When the erase test is started, the multiplexer 21M selects the address initial value of the address initial value register 211 under the control of the save/load control part 244. After the AFAIL is detected, the multiplexer 21M selects the address of the address save register 242 and supplies the address, which is an initial value, to the address arithmetic part 212. When the erase operation is started, the multiplexer 25M selects the number of loops of the initial value register 255 and sets the number of loops to the counter 254. After the AFAIL is detected, the multiplexer 25M selects the value of the save register 243 and sets the value to the counter 254.

Figure 12:
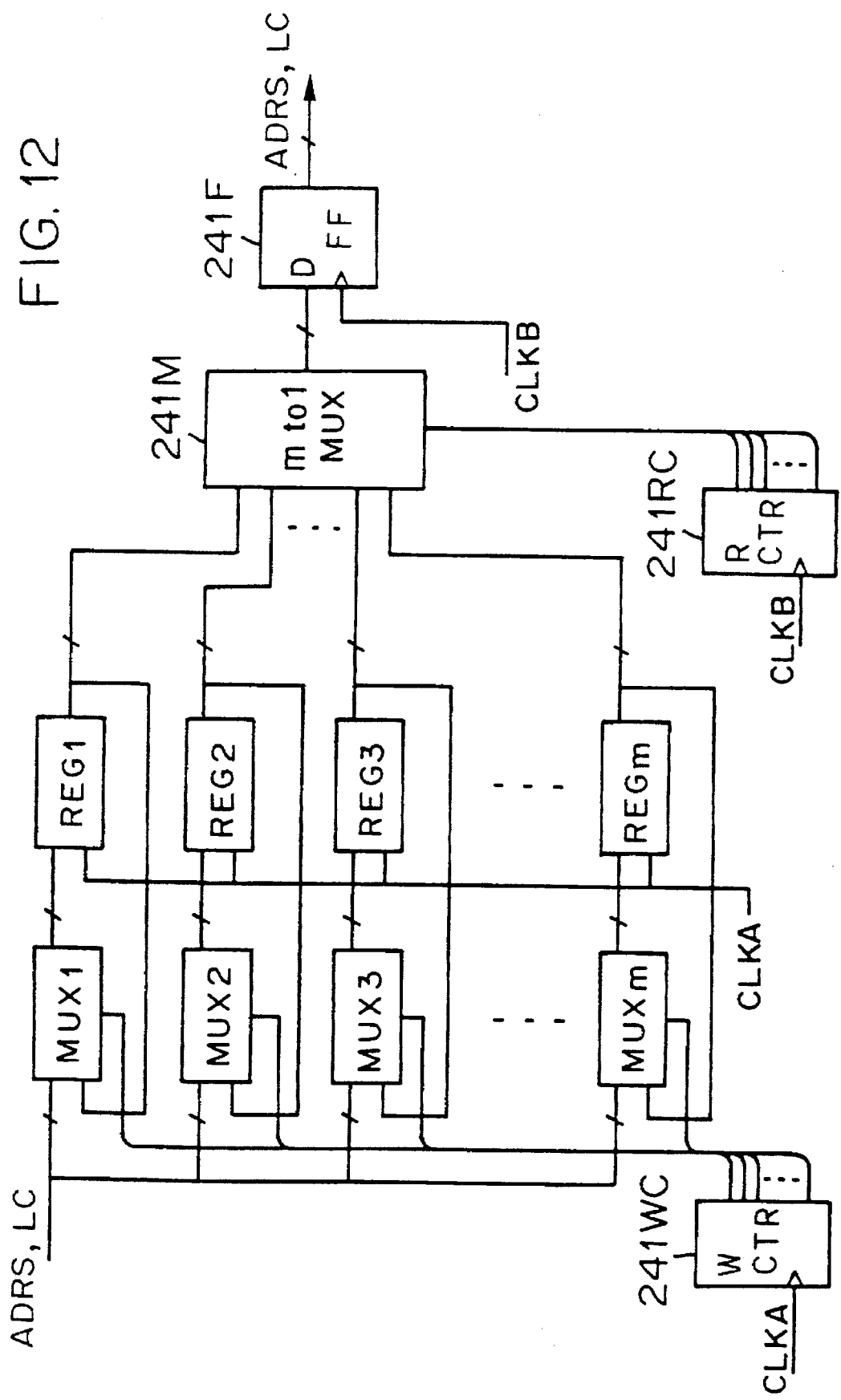
FIG. 12 is a block diagram showing the construction of a delay part 241 shown in FIG. 11.
Figure 13:
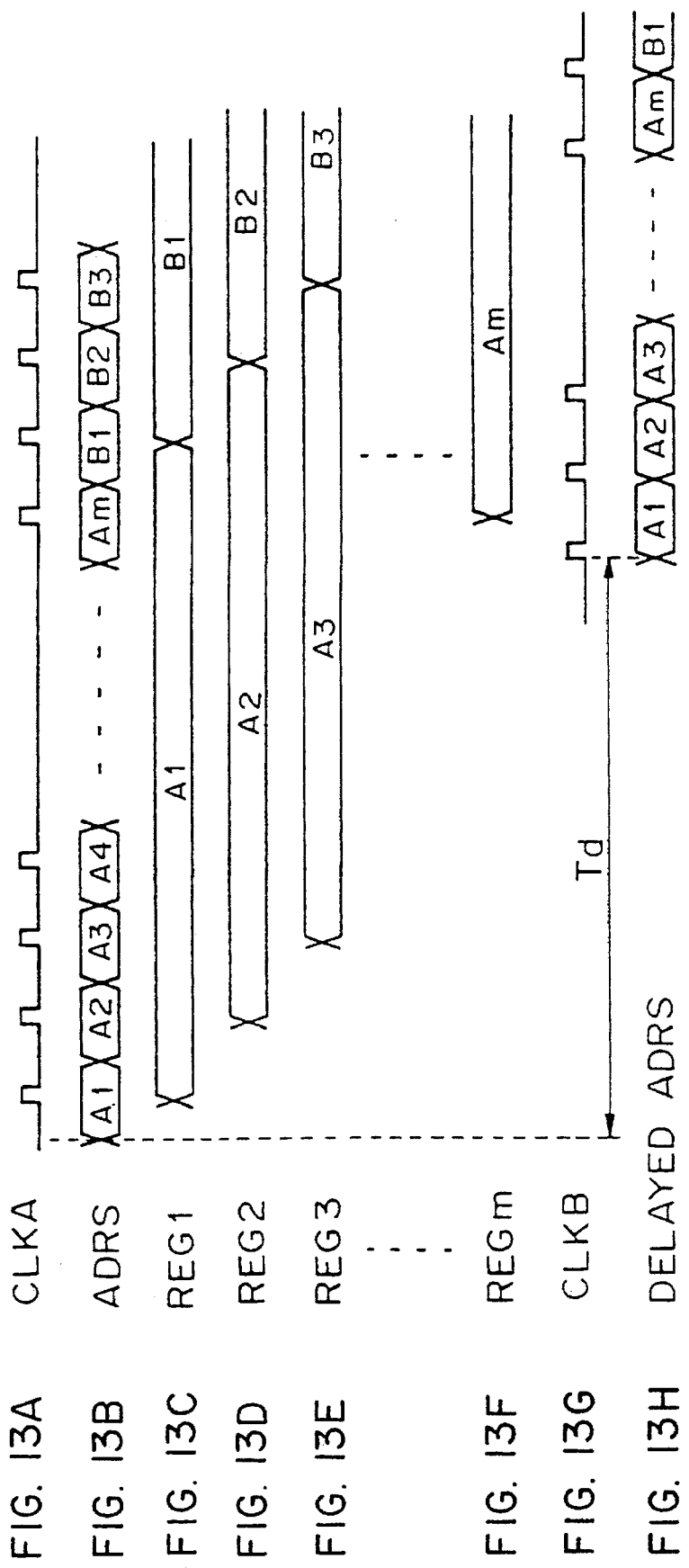
FIGS. 13A–H are timing charts for explaining the operation of the delay part shown in FIG. 12.

As shown in FIG. 12, the delay part 241 is a known interleave circuit comprising m multiplexers $MUX_1$ to $MUX_m$, m registers $REG_1$ to $REG_m$, a multiplexer 241M, a write counter 241WC, a read counter 241RC, and a flipflop 241F. The address ADRS and the loop count LC are input to first inputs of the multiplexers $MUX_1$ to $MUX_m$. Output signals of the multiplexers $MUX_1$ to $MUX_m$ are written to the registers $REG_1$ to $REG_m$, respectively, in synchronization with each pulse of the clock CLKA. The multiplexer 241M cyclically and successively selects the outputs of the registers $REG_1$ to $REG_m$ and outputs the selected data in series. The write counter 241WC cyclically and successively selects one of the multiplexers $MUX_1$ to $MUX_m$ for one period of the clock CLKA in synchronization therewith. The read counter 241RC controls the multiplexer 241M so that the contents of the registers $REG_1$ to $REG_m$ are cyclically read in synchronization with the clock CLKB. The flipflop 241F outputs the output data of the multiplexer 241M in synchronization with the clock CLKB. Output signals of the registers $REG_1$ to $REG_m$ are supplied to second inputs of the multiplexers $MUX_1$ to $MUX_m$, respectively. Thus, the multiplexers $MUX_1$ to $MUX_m$ are selected for the period (m−1) of the clock CLKA.

The delay amount Td of the address counter and the loop counter is given by the time Td after an address is generated by the address generating part 21 until the logically compared results AFAIL and OFAIL of data read from the address of the MUT are supplied to the save/load control part 244. The period of the clock CLKA is equal to the period of the clock CLKB. The clock CLKB has a phase with a delay of Td against the clock CLKA. Thus, as shown in FIGS. 13A–H, the input address ADRS of the delay part 241 is a sequence of m rows of data, each of which has a delay of the period of the clock CLKA. The m rows of data of the input address ADRS are cyclically and successively selected by the multiplexer 241M. Thus, the multiplexer 241M outputs the address ADRS with the delay of Td. In addition, the loop count value LC (not shown) is delayed by the interleave circuit in parallel with the address ADRS.

In the fourth embodiment shown in FIGS. 10 and 11, the address arithmetic part 212 of the address generating part 21 successively generates addresses in synchronization with the test clock CK without need to wait for the logically compared result P/F. The save/load control part 244 causes the save registers 242 and 243 to store the address ADRS and the loop count LC delayed by the delay part 241 corresponding to the first OFAIL (however, AFAIL=0). Thus, the save registers 242 and 243 store the address and the loop count value where the logically compared result of at least one test memory MUT is not AFAIL, but OFAIL. At this point, the address arithmetic part 212 has generated the next address. In other words, in the conventional construction, whenever information corresponding to FAIL or PASS (for example, MF or OFAIL), which is the compared result of the address, is received from the logical comparing part 40, since the command to be executed is controlled by the program controller 253 in the pattern generation program sequence, the address generating speed cannot be increased.

On the other hand, according to the fourth embodiment of the present invention, since the save/load control part which operates independently from the program counter controller 253, is provided, only the address generating arithmetic operation of the address arithmetic part 212 can be repeatedly executed until desired conditions of the logically compared result (OFAIL=1 and AFAIL=0) are detected. Thus, the apparatus according to the fourth embodiment can perform test at higher speed than the conventional apparatus. In the conventional apparatus, when the allerase operation is performed, to determine the result of the erase operation, the addresses of the test memory should be read from the initial value stored in the address initial value register 211. Thus, sequential addresses that have been determined PASS should be read and logically compared. Thus, time loss takes place. However, according to the fourth embodiment of the present invention, since an address and a loop count value thereof where OFAIL (OFAIL=1 and AFAIL=0) is detected are stored in the save registers 242 and 243, respectively, when the next address generating sequence is executed, the values of the registers 242 and 243 are set to the address arithmetic part 212 and the loop counter 254, respectively. Thus, in the region of the address initial value to the address where the OFAIL was detected, the read operation and the logical comparing operation can be omitted. Consequently, the test time can be reduced.

Figure 14:
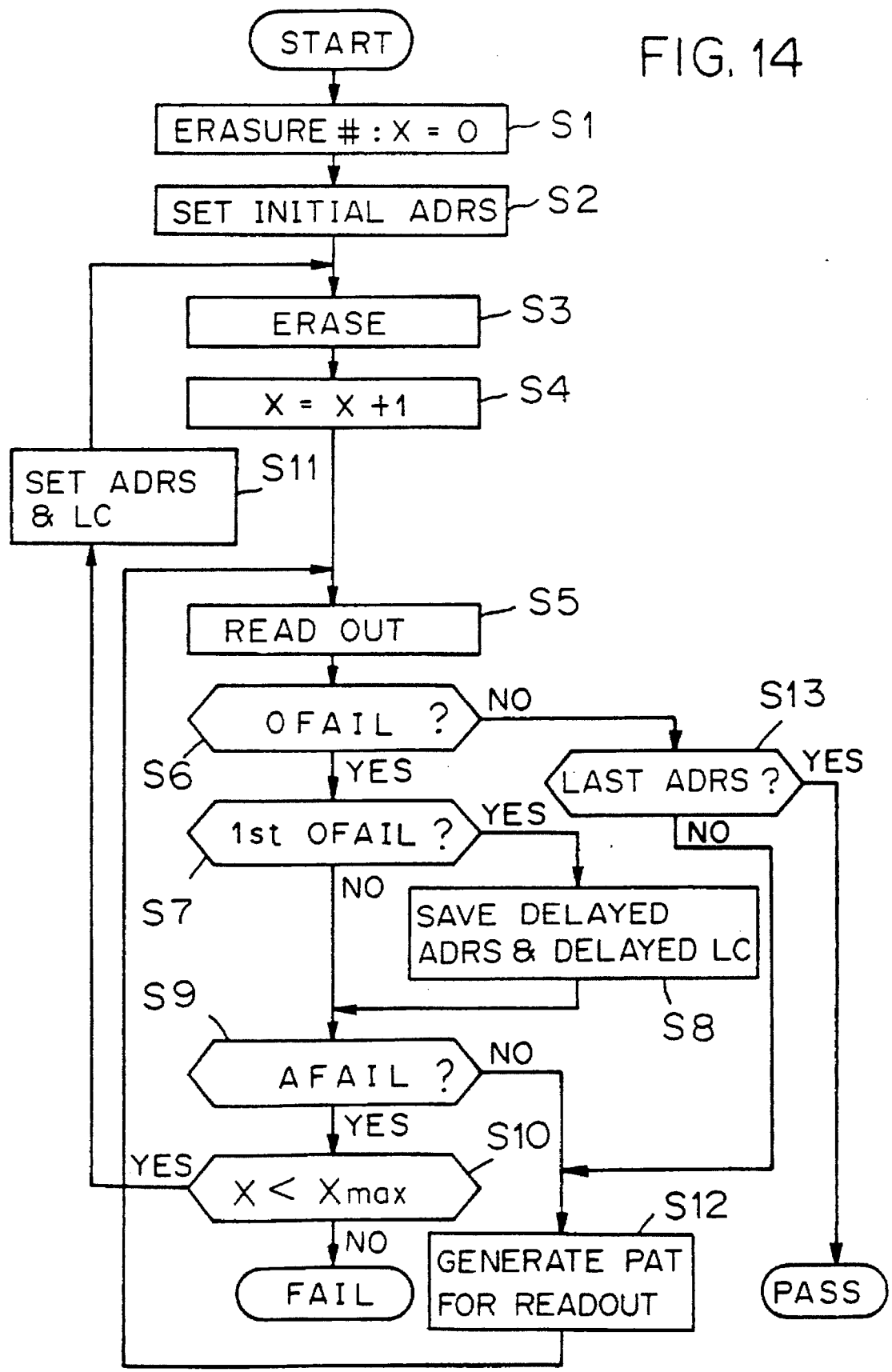
FIG. 14 is a flow chart showing the operation of an erase test according to the fourth embodiment shown in FIG. 10.
Figure 15:
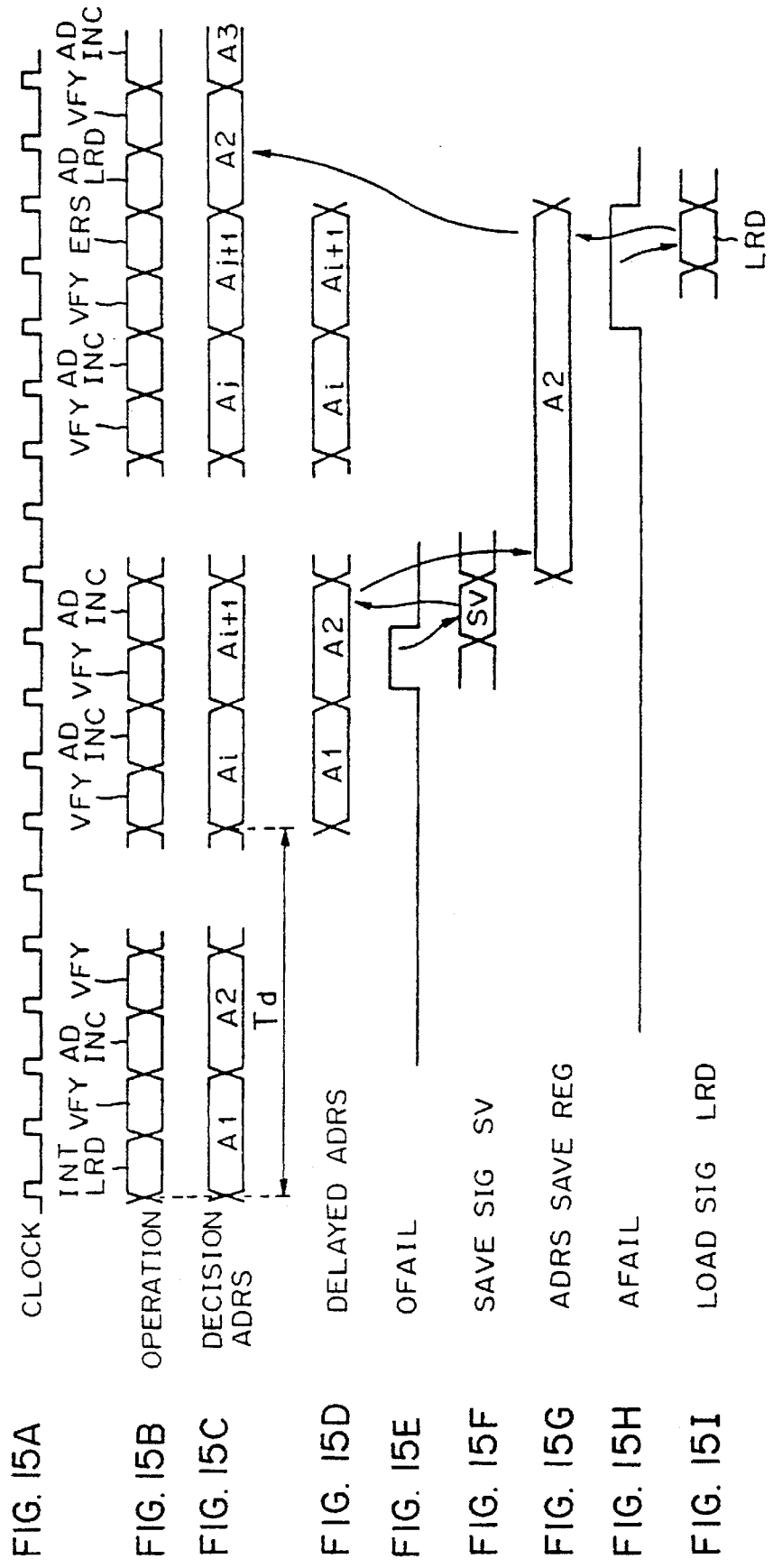
FIGS. 15A–I are timing charts showing the operation of the erase test shown in FIG. 14.

FIG. 14 is a flow chart showing the operation of the fourth embodiment shown in FIG. 10. FIGS. 15A–I show the case that OFAIL=1 and AFAIL=0 at address A2 and that OFAIL=1 and AFAIL=1 at address Ai+1.

At step S1, the number of initial erase times X is set to "0". At step S2, the initial address of the register 211 is set to the address arithmetic part 212. At step S3, the entire content of the test memory or a block thereof is erased at the same time. At step S4, the number of erase times X is incremented by "1". At step S5, data is read from a predetermined address of the memory MUT. At step S6, it is determined whether or not at least one of test memories is FAIL. When the determined result is YES at step S6, the flow advances to step S7. At step S7, it is determined whether or not the detected OFAIL is the first FAIL after the erase operation has been performed. When the determined result is YES at step S7, the flow advances to step S8. At step S8, the delay address and the delay loop number where the first FAIL was detected are stored in the save registers 242 and 243, respectively. The flow advances to step S9. When the determined result is NO at step S7, the flow advances to step S9.

At step S9, it is determined whether or not all the test memories are FAIL (namely, AFAIL=1). When AFAIL=1, the logically compared result of read data performed after step S3 represents that at least one address of each MUT is FAIL. Data of each memory cell of the flash memory is not erased by one erase operation. Thus, at X=1, AFAIL=0 does not take place in most cases. Next, the flow advances to step S10. At step S10, it is determined whether or not the number of erase times X is less than the predetermined value. When the determined result is NO at step S10, it is determined that all the memories MUT are FAIL. When the determined result is YES at step S10, the flow advances to step S11. At step S11, the delay address and the delay loop number stored in the save registers 242 and 243 are set to the address arithmetic part 212 and the loop counter 254, respectively. The flow returns to step S3. At step S3, the allerase operation is performed again. Thereafter, the abovedescribed steps are repeated. In the forth embodiment, the address where the read operation is performed at step S5 and the determination is performed at step S6 in the second or later erase operation (X is larger than or equal to 2) is the delay address stored when FAIL=1 (however, AFAIL=0) is detected. Thus, since the test cycle for the region in the range from the initial address to the delay address is omitted, the time for the erase test can be reduced.

When the determined result is NO at step S9, along with the condition of OFAIL=1 at step S6, at least one memory MUT is PASS. Thus, the flow advances to step S12. At this point, the pattern generating parts 21, 22, and 23 generate patterns necessary for read operation and logical comparing operation (namely, increment of address). The flow returns to step S5. At step S5, the data of the updated address is read. At step S6, it is determined whether or not OFAIL was detected. When the determined result is NO at step S6, data of the memory cell at the present address of all the memories MUT has been erased. The flow advances to step S13. At step S13, it is determined whether or not the present address is the last address. When the determined result is YES at step S13, the MUT is PASS. When the determined result is NO at step S13, the flow advances to step S12. At step S12, the address is updated for reading data. The flow returns to step S6.

When the write test is performed by each of the semiconductor memory test apparatuses shown in FIGS. 1, 3, 5, 6, and 10 for the flash memory by repeating the write test for each address of the flash memory, as the number of times of the write operation increases, the number of addresses that have not been passed decreases. However, in the above-described tests, whenever the write operation is performed, all addresses are generated. Thus, the test time for each write operation is the same. In other words, for addresses that have been passed, whenever the write test is performed, the write enable signal WE is inhibited from being supplied. However, in the operation cycle, the write test is substantially performed. In other words, since addresses that have been passed are repeatedly determined, the number of times of the test is not decreased and thereby the test time is not reduced.

(Fifth Embodiment)

Figure 16:
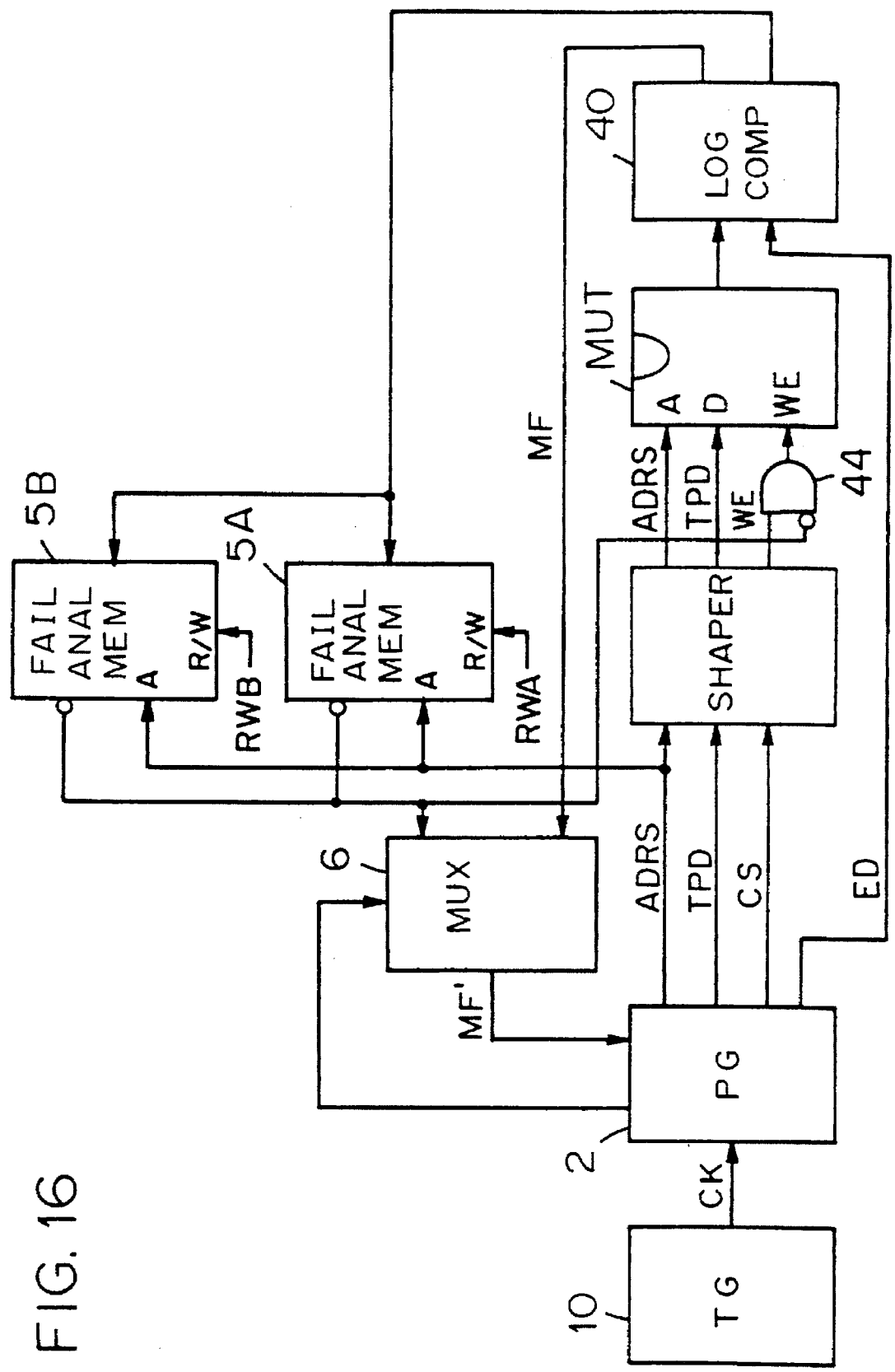
FIG. 16 is a block diagram showing the construction of an apparatus according to a fifth embodiment of the present invention.

FIG. 16 shows an apparatus according to a fifth embodiment of the present invention. In the fifth embodiment, the problem in the convention construction and the above-described embodiments is solved. As shown in FIG. 16, in the fifth embodiment, two fail analyzing memories 5A and 5B are provided. The two fail analyzing memories 5A and 5B are controlled with read/write control signals RWA and RWB so that when one of the memories 5A and 5B is in read mode, the other is in write mode. In addition, one of a match flag MF received from a logical comparing part 40 (similar to those of the abovedescribed embodiments) and a fail information FAIL read from the fail analyzing memories 5A and 5B is selected by a multiplexer 6. The multiplexer 6 outputs a match flag MF'. The match flag MF' is supplied to a pattern generator 2.

As will be described later, in the fifth embodiment, FAIL information obtained in the last write test is stored in one fail analyzing memory (for example, 5B). When FAIL=1 as the former test result has been written to a corresponding address of the fail analyzing memory 5B for each address of the test memory MUT in the present test, by executing the program setup operation, program (write) operation, and the program verify operation, the write test is performed. When the result of the test is FAIL, it is written to a corresponding address of the fail memory 5A. When FAIL=1 has not been written to the fail analyzing memory 5B (namely, the result is PASS), the operation cycle is omitted and the next address is tested. Thus, as the number of addresses that have been passed increases in the write test, the test time for these addresses is reduced. Consequently, the write test for many memories can be executed in a short time. When the next write test is started, the content of the fail analyzing memory 5B is erased. Thereafter, with reference to the content of the FAIL information in the fail analyzing memory 5A, similar test is performed. The fail information, which is the test result, is written to the fail analyzing memory 5B.

Figure 17:
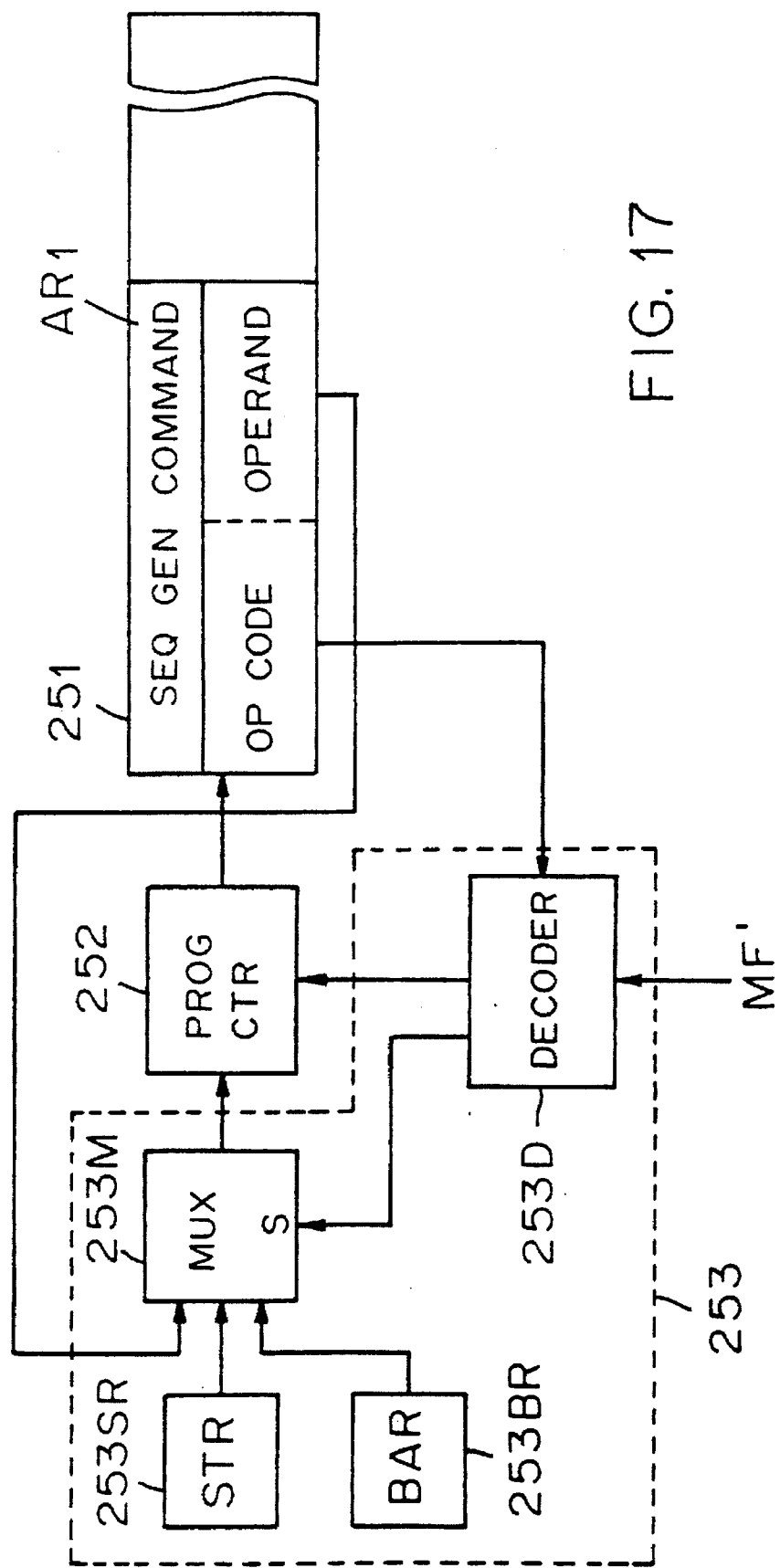
FIG. 17 is a block diagram showing a part of the pattern generator 2 shown in FIG. 16.

FIG. 17 shows the construction of a program counter controller 253 of the pattern generator 2 according to the fifth embodiment of the present invention. In addition, FIG. 17 shows a program counter 252 and a part of an instruction memory 251. The program counter controller 253 comprises a decoder 253D, a multiplexer 253M, a start address register 253SR, and a branch address register 253BR.

When a pattern generation program stored in the instruction memory 251 is executed, the register 253SR that stores a start address of the program is selected by the multiplexer 253M. Thus, the start address is loaded to the program counter 252. A sequence control command corresponding to the start address of the instruction memory 251 is decoded and the next operation of the program counter is determined.

The program counter 252 executes one of hold (NOP), increment (INC), and load (LRD) operations. When the load operation is executed, one of an operand of the instruction memory 251, the start address register 253SR, and the branch address register 253BR is selected with a sequence control command by the multiplexer 253M.

The pattern generation program commands includes a match flag sense command that controls the generation of the sequence corresponding to the logically compared result, which is the output of the test memory MUT. When the match flag sensor command is executed, if the output of a designated pin of the test memory MUT matches with the expected data ED, a match takes place. In this case, the logical comparing part 40 outputs a match flag signal MF to the pattern generator 2. With the flag MF, the program counter 252 is incremented by "1". When the match does not take place, an operand is loaded from the instruction memory 251 to the program counter 252 through the multiplexer 253M. Normally, the pattern generation program is designed so as to form a loop that waits for the flag MF until the match takes place. When the match does not take place after the loop was executed a predetermined number of times, the process branches to an address designated by the branch address register 253BR. Although there are other flag sense commands that perform different operations, since they are out of the scope of the present invention, their description is omitted.

The flash memory is a nonvolatile memory that has a large storage capacity and is rewritable a large number of times. The flash memory has a sequence of operation modes such as data read mode, write mode (program mode), write verify mode (program verify mode), and erase mode. These operation modes are set by writing predetermined commands to the controller of the memory with a write enable signal. The flash memory does not have a dedicated command input terminal. The commands are input from data terminals of the flash memory. The switching of the data input mode and the command input mode is performed by varying the voltage of the power supply terminal.

Figure 18:
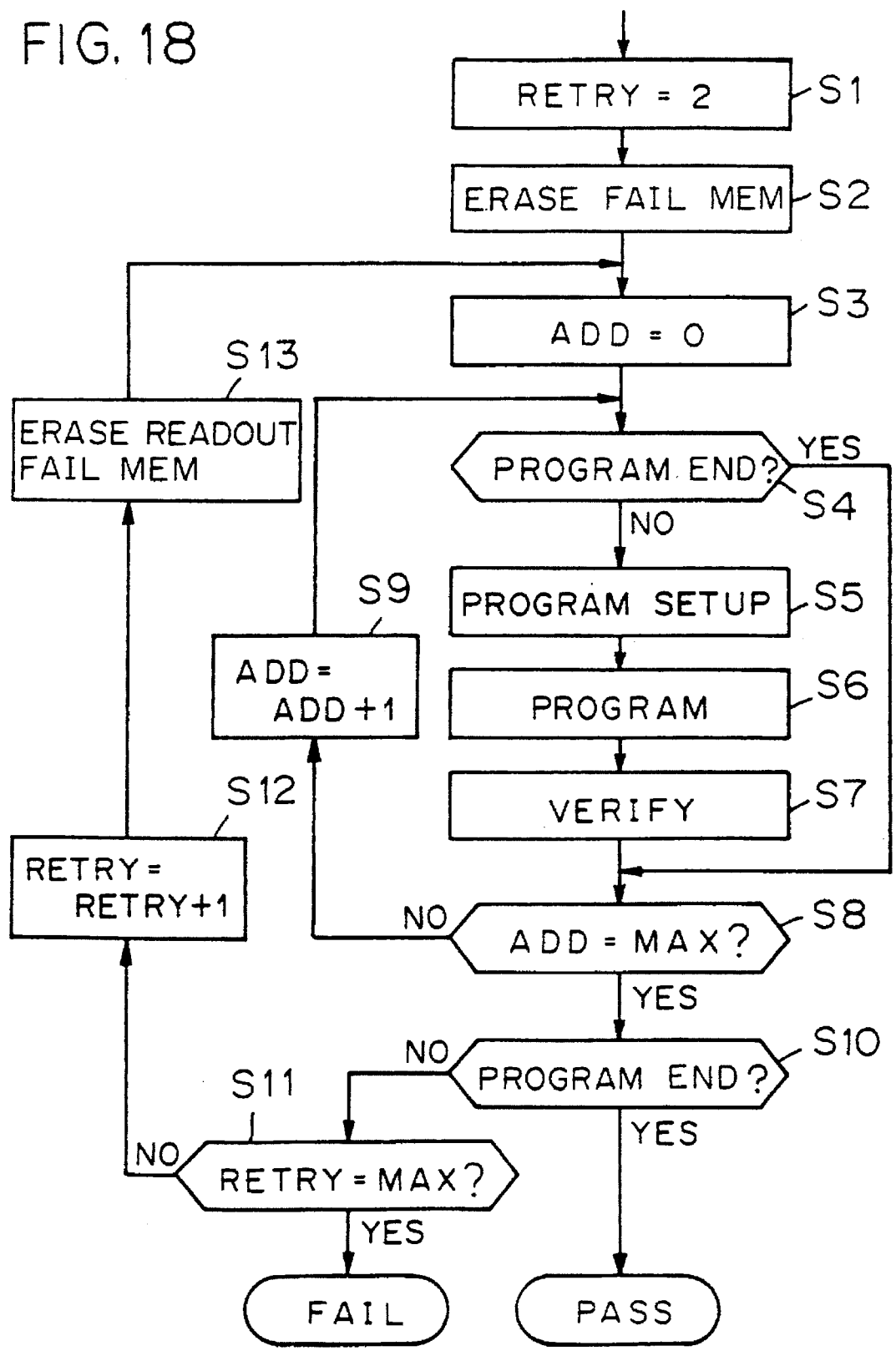
FIG. 18 is a flow chart showing the operation of a write test according to the fifth embodiment shown in FIG. 16.
Figure 20:
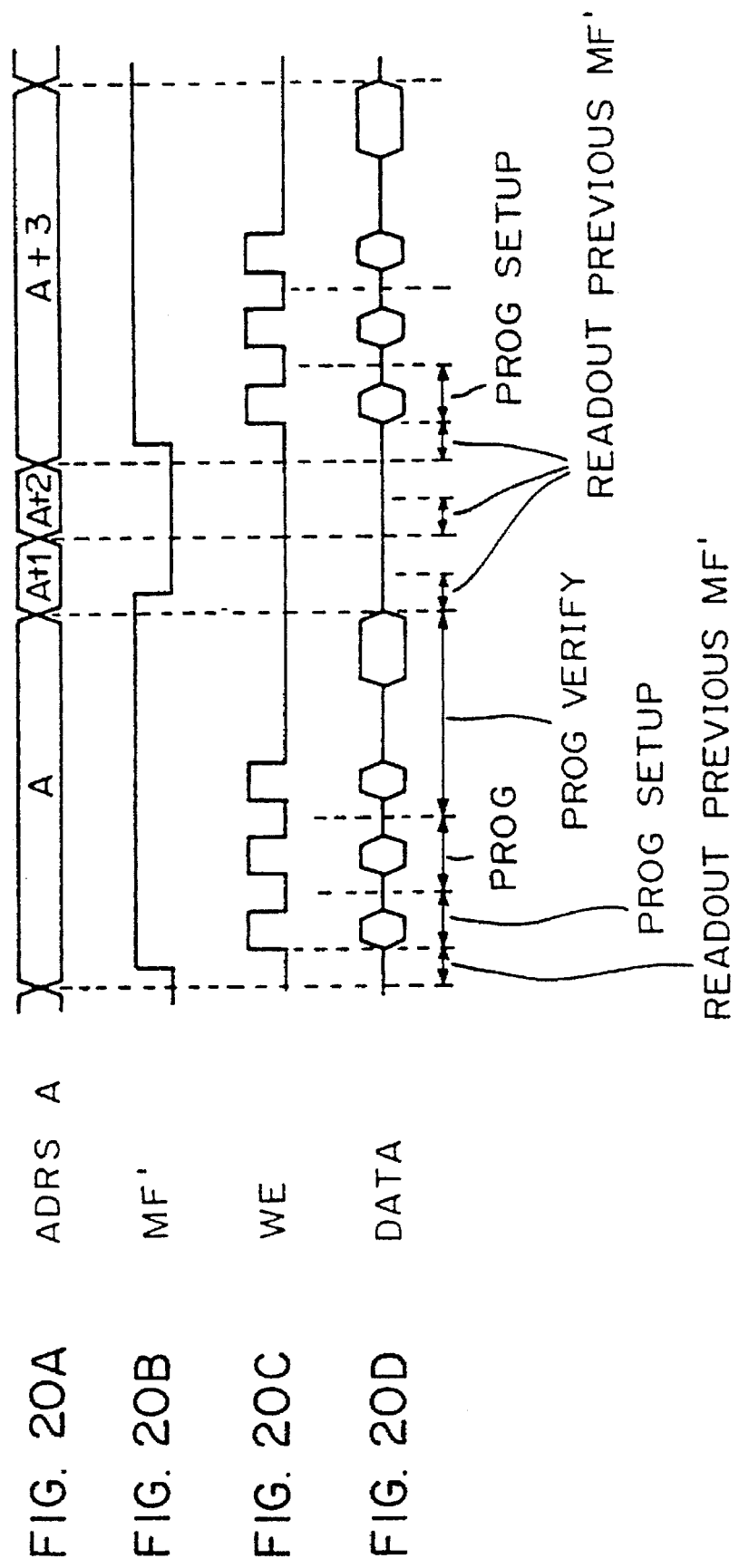
FIGS. 20A–D are timing charts showing the operation for executing the program shown in FIG. 19.

FIG. 18 is a flow chart For explaining the procedure of second or later write test performed for the flash memory according to the fifth embodiment of the present invention. In the first write test, the multiplexer 6 selects the output of the logical comparing part 40. At this point, since the result of the write test has not been written to the fail memory, the first write test is performed in the same manner as that of the conventional apparatus. The write test is performed successively for each address without reference to the fail memory. The FAIL information is written to a corresponding address of one fail memory (for example, 5A). After the first write test was completed, at step S1, the number of write times RETRY is set to "2". At step S2, the content of the other fail memory 5B is erased. At step S3, initial address ADD=0 is generated. At step S4, the former FAIL information is read from a corresponding address of the fail memory 5A and it is determined whether or not the write operation (program) has been completed. When the determined result is NO at step S4, the flow advances to step S5. At step S5, the address is stored in the test memory. The command of the program setup mode is written from the data terminal. At step S6, the program mode takes place. In the program mode, data is written from the data terminal.

At step S7, the present mode is changed to the verify mode while the write data is held. At this point, the controller of the memory reads the data therefrom and compares it with write data. When they do not match, a program fail signal FAIL is output from the test memory. Thus, it is determined that the write operation failed at this address. Data FAIL is written to a corresponding address of the fail memory 5B. At step S8, it is determined whether or not the address ADD is equal to the maximum address MAX. When the determined result is NO at step S8, the flow advances to step S9. At step S9, the address ADD is incremented by "1". The flow returns to step S4. At step S4, the same write test is performed. The compared results are written to the fail analyzing memory 5A and the sequence of these steps is repeated for all addresses to be tested. When the determined result is YES at step S8, the flow advances to step S10. At step S10, it is determined whether or not all addresses have passed.

In the fifth embodiment, when the last test result read from corresponding addresses of the fail analyzing memories 5A and 5B has passed (programmed) at step S4, the write tests at steps S5, S6, and S7 are not executed, but jumped to step S8, thereby remarkably reducing the test time of the memory test. FIG. 19 shows an instruction program that executes steps S4 to S9.

In FIG. 19, code NOP in the sequence generation command area AR1 represents an operation code that simply increments an instruction address of the program counter 252. If the former test result is PASS, a conditional jump code JIP at address ST0 of the instruction memory causes the flow to jump to address ST1 of the instruction memory. Otherwise, the conditional jump code JIP causes the flow to advance to three NOP operation codes at three successive addresses that follow. In the control signal generation area AR4 of these three addresses, commands that generate program setup control signal, program control signal, and program verify control signal are written. At address ST1 of the instruction memory, a jump code JMX is written. The jump code JMX causes the test address ADD to increment and the flow to jump to counter address STO. Thus, by executing the instruction sequence shown in FIG. 19, steps S4 to S9 shown in FIG. 18 can be repeatedly executed.

FIG. 20A–D are timing charts for which the instruction sequence shown in FIG. 19 is executed. Test address A for the MUT represents that former test result information MF read from the fail analyzing memory is FAIL. Thus, the write test is executed in three cycles of program setup (data input), program (write), and program setup (read). The next two test addresses A+1 and A+2 represent that the former test result information MF' read from the fail analyzing memory is PASS. At these test addresses, the three cycles are omitted. Thus, the flow advances to the next test addresses A+2 and A+3. Consequently, the test time of the MUT can be reduced.

In the write test of the flash memory, each address will not pass with one write operation. Thus, at step S11, it is determined whether the number of write times RETRY is less than the predetermined times MAX. At step S12, the number of write times RETRY is incremented. At step S13, the content of the fail memory 5A where the former FAIL information was read at step S13 is erased. The flow returns to step S3. In the third or later write test, the test is repeated in the same address sequence. As described above, in the flash memory, data is inhibited from being rewritten to an address where data has been successfully written. Thus, with reference to the fail analyzing memory that stores the former test results, the write enable signal is inhibited from being supplied to addresses that have passed. When data can be written to all memory cells of the test memory with the write operation performed within the number of the predetermined times (for example, 20 times or less), it is determined that this test memory is good.

Figure 21:
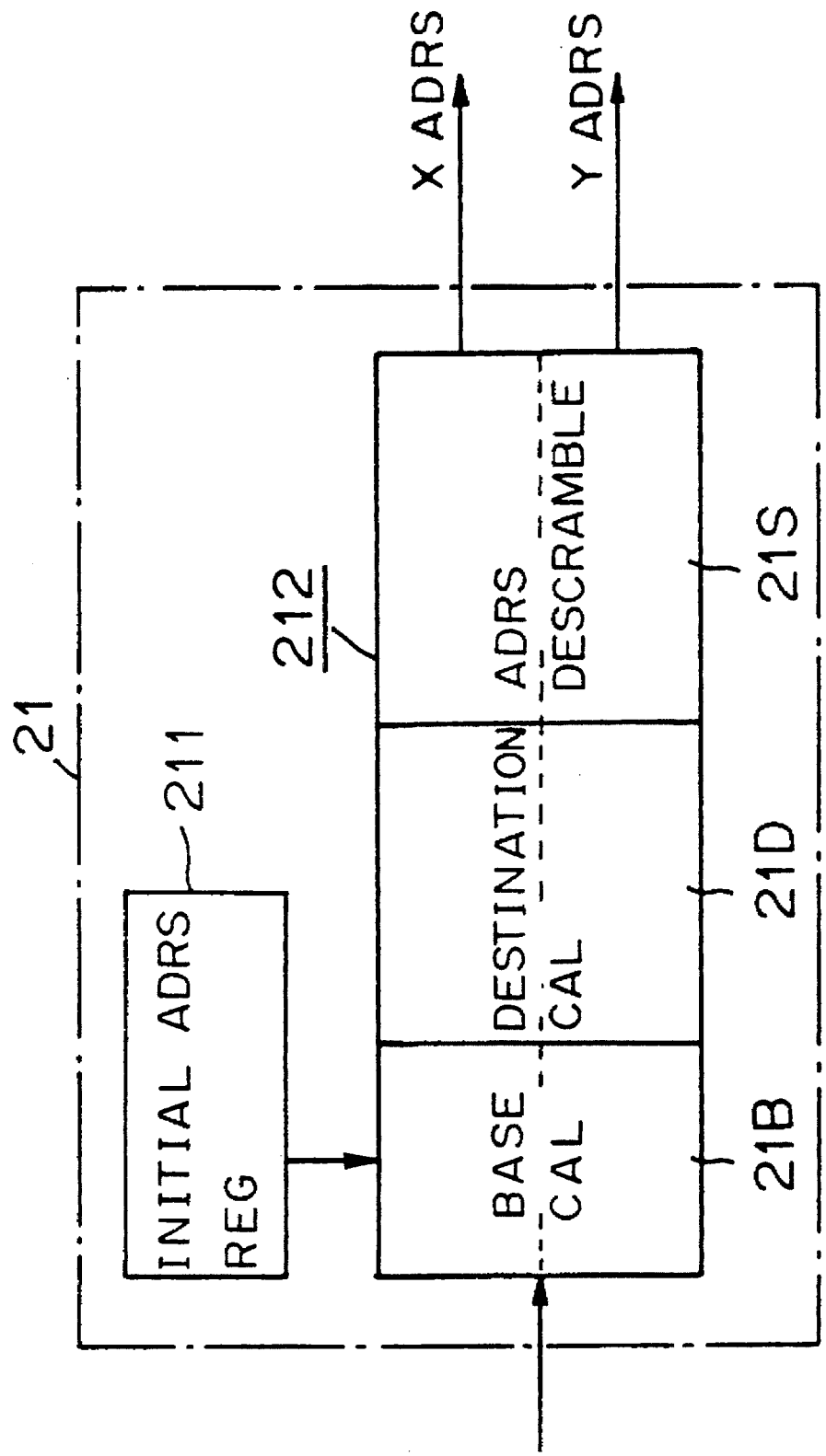
FIG. 21 is a block diagram for explaining an address arithmetic operation of a conventional address generating part 21.
Figure 22:
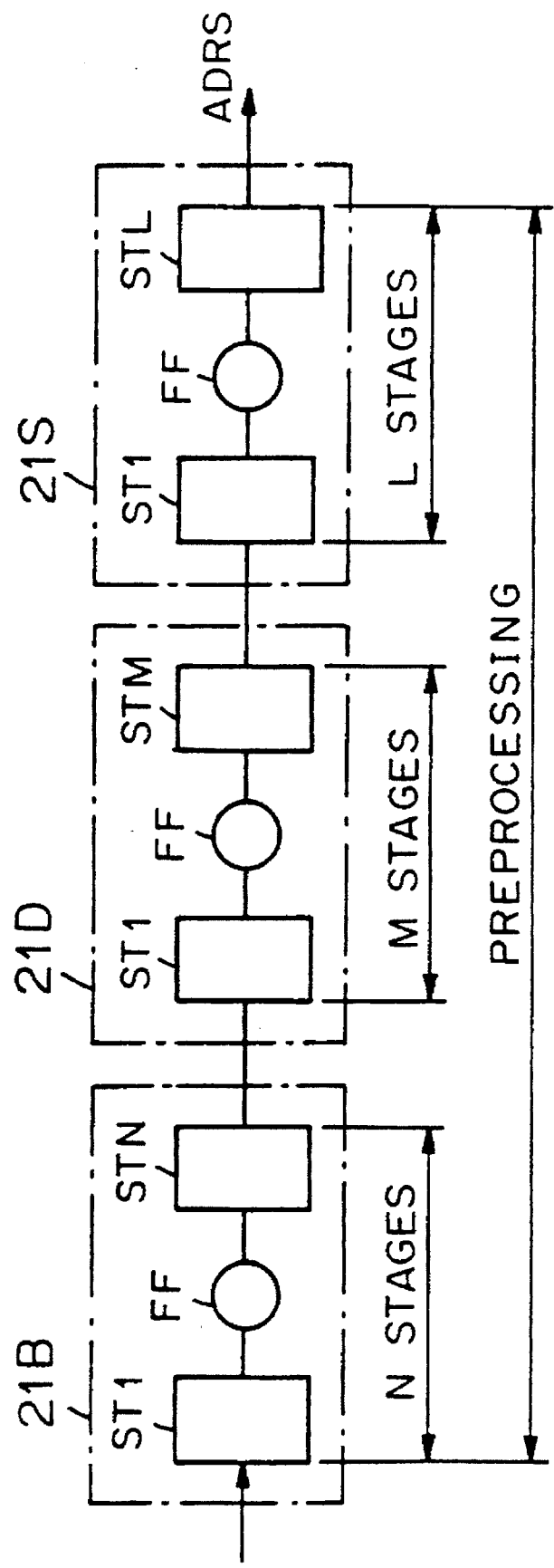
FIG. 22 is a block diagram showing a pipeline construction of the address arithmetic part shown in FIG. 21.

The conventional semiconductor memory 21 has a pattern generator 2 as shown in FIG. 8. The pattern generator 2 has an address arithmetic part in the address generating part 21. As shown in FIG. 21, the address arithmetic part comprises a base arithmetic part 21B, a destination arithmetic part 21D, and an address descrambler part 21S. The base arithmetic part 21B generates an address of a considered cell. The destination arithmetic part 21D generates an address of a disturb cell against the considered cell. The address descrambler part 21S converts a logical address into a physical address. As shown in FIG. 22, these parts are pipelined. Thus, since these parts are preprocessed, a pattern can be generated at high speed. Each of these parts is further divided into a plurality of cycles so as to increase the process speed. The disturb address is an address of an adjacent cell of the considered cell and generated to check the effect of the write operation. Since conventional DRAM and SRAM each have a decoder that scrambles input address data, the address descramble part converts a logical address generated through the base arithmetic part 21B and the destination arithmetic part 21D into a physical address corresponding to the test memory MUT.

For example, in the base arithmetic part 21B, the arithmetic operation performed after a code command for designating an address of a considered cell is input until the result of the arithmetic operation is output is divided into for example three steps (1) fetching the code command (ST1), (2) decoding the code command (ST2), and (3) performing arithmetic operation for the decoded command (ST3). Thus, the arithmetic operation can be executed in a pipeline construction consisting of three stages. Each step is isolated by a flipflop FF. The destination arithmetic part 21D performs much more complicated arithmetic operation than the base arithmetic part 21B. Thus, the number of stages of the pipeline construction of the destination arithmetic part 21D should be further divided. This applies to the address descrpamble arithmetic part 21S. Assuming that the number of stages of the pipeline of the base arithmetic part 21B is N, the number of stages of the pipeline of the destination arithmetic part 21D is M, and the number of stages of the pipeline of the address descramble arithmetic part 21S is L, a total number of stages of the address generation pipeline becomes W=(N+M+L).

Figure 23:
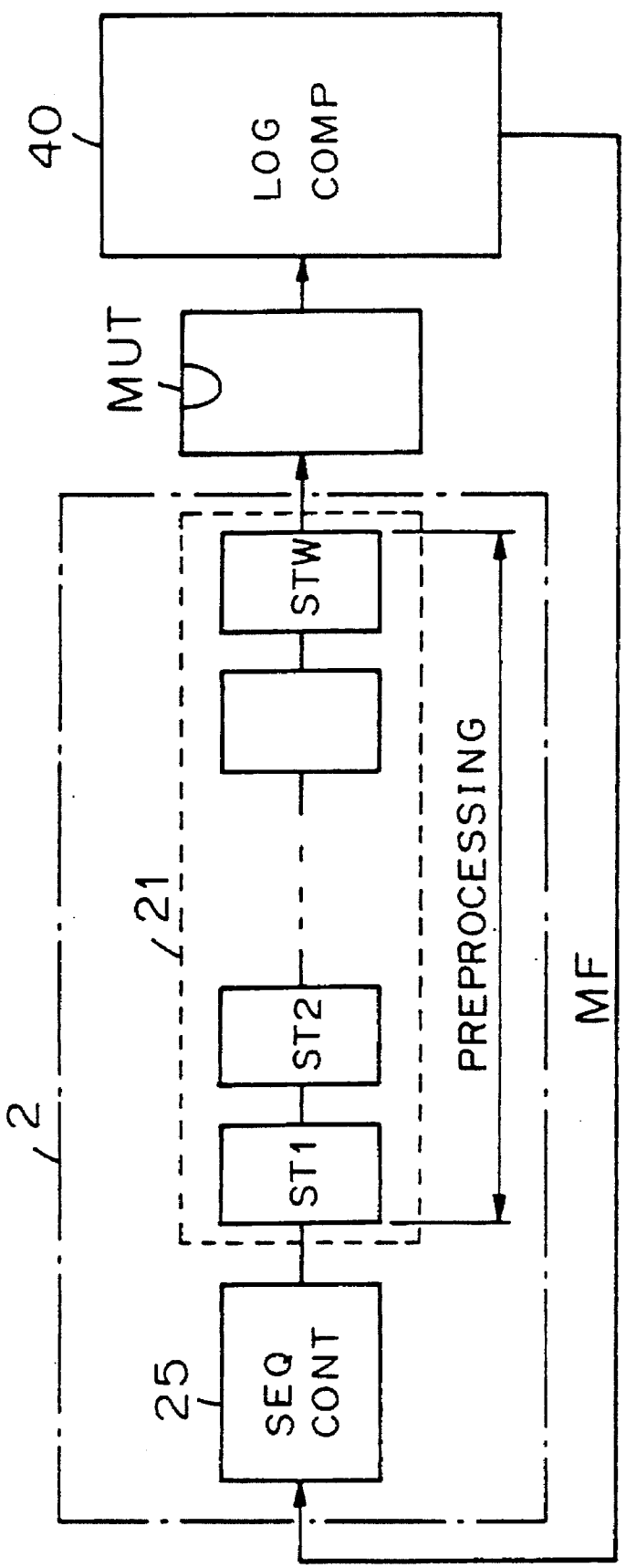
FIG. 23 is a block diagram showing a simplified construction of the conventional semiconductor memory test.

When the write test of the flash memory is performed, as shown in FIG. 23, the sequence control part 25 of the pattern generator 2 executes a conditional branch command in the pattern generation sequence corresponding to the determined result of for example match flag MF. However, the conditional branch command causes a pattern to be generated to the test memory MUT, the pattern to be input, the test memory MUT to be evaluated, and a branch control corresponding to the determined result to be performed. In this case, a preprocess for executing the next command upon completion of the determination of the test memory MUT is performed. This operation is referred to as "reloading a command to the pipeline". In the test of the flash memory, the time necessary for the preprocess causes the test time to increase. Unlike with DRAM and SRAM, in the flash memory, the input address is not scrambled. In addition, the write operation and the erase operation are repeated several times until they are successfully performed. Moreover, the entire data of the flash memory or a block thereof is erased at the same time. In the write and erase tests for the flash memory, at present time, the disturb test for each memory cell is not required.

(Sixth Embodiment)

Figure 24:
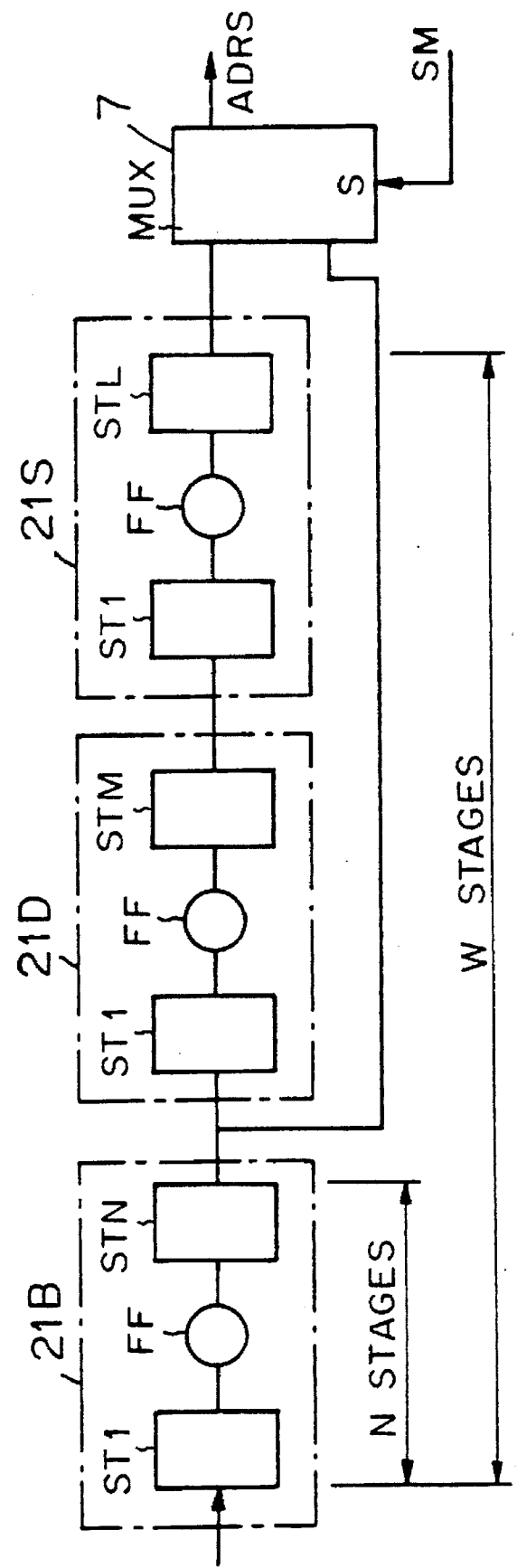
FIG. 24 is a block diagram showing the address arithmetic part of an embodiment according to a sixth embodiment of the present invention.

FIG. 24 shows a semiconductor memory test apparatus according to a sixth embodiment of the present invention. In the sixth embodiment, the pipeline of the address generating part 21 shown in FIG. 22 of the pattern generator 2 in each of the semiconductor memory test apparatuses shown in FIGS. 1, 3, 5, 6, and 16 is constructed in such a manner that the output of the base arithmetic part 21B and the output of the address descramble part 21S are input to the multiplexer 7. The multiplexer 7 selects one of the inputs depending on whether the test memory MUT is conventional DRAM/SRAM or flash memory.

In other words, the address generating part 21 according to the sixth embodiment comprises a base arithmetic part 21B, a destination arithmetic part 21D, an address descramble part 21S, and a multiplexer 7. The base arithmetic part 21B generates an address of a considered cell. The destination arithmetic part 21D generates an address of a disturb cell. The address descramble part 21S converts a logical address into a physical address. The base arithmetic part 21B, the destination arithmetic part 21D, and the address descramble part 21S are connected in series. A first input of the multiplexer 7 is connected to an output of the address descramble arithmetic part 21S. A second input of the multiplexer 7 is connected to an output of the base arithmetic part 21B. When the memory test is started, a skip mode signal SM is applied to a switching terminal through a pattern generator 2. Thus, one of the arithmetic result of the base arithmetic part 21B and the output of the address descramble part 21S is selected and output.

In the write test of the flash memory, data is successively written to memory cells and it is determined whether these memory cells are PASS or FAIL. Thus, addresses can be generated by a simple incremental operation of the base arithmetic part 21B. Thus, it is not necessary to perform destination arithmetic operation and address descramble arithmetic operation that require complicated operations a large number of times. The arithmetic operations performed in the base arithmetic part 21B are for example+1, 1, *2 (* means a multiplication), and/2 (/means a division).

The semiconductor memory test apparatus having the address generating part 21 according to the sixth embodiment performs the test of the conventional DRAM and SRAM by connecting the output of the address scramble part 21S to the multiplexer 7. The apparatus performs the write and erase tests of the flash memory by connecting the output of the base arithmetic part 21B to the multiplexer 7 with the skip mode signal SM. In this case, the destination arithmetic part 21D and the address descramble part 21S are bypassed.

Thus, in the write and erase tests for the flash memory, the pipeline of parts other than the arithmetic operations of the base arithmetic part 21B can be skipped, thereby reducing the time for the preprocess. In other words, the number of stages of the address generation pipeline is normally given by the total number of N stages of the base arithmetic part 21B, M stages of the destination arithmetic part 21D, and L stages of the address destination part 21S (namely, W=N+M+L). However, since arithmetic operations on the M stages of the destination arithmetic part 21D and L stages of the address descramble part 21S are skipped, addresses can be generated by the arithmetic operations on N stages of the base arithmetic part 21B. As described above, since the value of (M+L) is large, the time reduction of the test time of the flash memory test apparatus is large.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. An apparatus for testing semiconductor memories, comprising:

pattern generating means for generating an address pattern of address signals each specifying an address of a memory under test, a test data pattern of test data signals to be written into addresses of said memory under test specified by said address signals, expected data to be compared with test data signals read out of specified addresses of said memory under test, and a control signal for controlling the operation of said memory under test, in accordance with a program for determining a sequence of pattern generation, and for applying said test data pattern, said address pattern, and said control signal to said memory under test, said control signal including an operation status control signal for controlling a write/read operation of data into/from said memory under test;

comparing means, receiving data read out of said memory under test and said expected data, for comparing said data from said memory under test with said expected data and outputting a signal that represents a pass obtained as a result of the comparison therein when said data from said memory under test matches said expected data or outputting a signal that represents a fail obtained as a result of the comparison therein when said data from said memory under test does not match said expected data;

inhibit signal holding means, connected to the output side of said comparing means, for holding said signal that represents a pass outputted from said comparing means and outputting the pass signal as an inhibit signal;

inhibit gate means, receiving said inhibit signal from said inhibit signal holding means and responsive thereto, for inhibiting said operation status control signal from being supplied to said memory under test thereby preventing said test data pattern from being written into said memory under test;

inhibit means, connected to the output side of said comparing means, for inhibiting said signal that represents a pass or fail from said comparing means from being outputted when said inhibit signal is supplied to said inhibit means.

2. The memory testing apparatus as set forth in claim 1, further comprising:

a plurality of test channels in parallel, each of which comprises one said memory under test, said inhibit gate means, said comparing means and said inhibit signal holding means; and all-match detecting means, receiving signals outputted from all of said comparing means in respective test channels, for outputting a match flag to said pattern generating means when all the signals from said comparing means are pass signals; and wherein said pattern generating means is adapted for controlling the pattern generating sequence depending upon whether or not the match flag is supplied thereto.

3. The memory testing apparatus as set forth in claim 1, further comprising:

waveform shaping means, connected to an output side of said pattern generating means, for shaping each test pattern supplied from said pattern generating means into a desired logical waveform and supplying it to said inhibit gate means; and driver means, connected to an output side of said inhibit gate means, for converting a test pattern of the desired logical waveform received from said inhibit gate means into a real waveform having a desired voltage.

4. The memory testing apparatus as set forth in claim 1, further comprising counting means for counting the number of occurrences of fail signals outputted from said comparing means and supplying, as a disaccord detection signal, a signal representing that the number of occurrences of fail signals is equal to a predetermined number of occurrences, to said inhibit signal holding means thereby disabling said inhibit gate means and said inhibit means.

5. The memory testing apparatus as set forth in claim 4, wherein said pattern generating means is adapted to generate a clear signal and to supply it to said inhibit signal holding means when an address of the memory under test is updated, so that said inhibit signal holding means cancels said inhibit signal held therein, whereby said inhibit gate means and said inhibit means are enabled.

6. The memory testing apparatus as set forth in claim 4, further comprising:

means for reading out a count value of said counting means; and fail analyzing memory means for storing said count value therein.

7. An apparatus for testing semiconductor memories, comprising:

pattern generating means for generating a test pattern including at least a sequence of test data to be supplied to a memory under test and expected data to be compared with test data read out of said memory under test;

comparing means, receiving data read out of said memory under test and said expected data generated from said pattern generating means, for comparing said data from said memory under test with said expected data bit by bit and outputting decision information of plural bits, each bit representing a match or disaccord between said data from said memory under test and said expected data obtained as a result of the bit by bit comparison therein, said comparing means includes means for outputting, as an inhibit signal, a signal that represents a match obtained as a result of the comparison in said comparing means when said data from said memory under test matches said expected data;

a plurality of counting means, one for each bit of said decision information outputted from said comparing means, and being adapted for counting a number of occurrences of disaccord for an associated bit;

inhibit gate means, receiving said inhibit signal from said means for outputting, for supplying said inhibit signal to said memory under test to control the operation of said memory; and counting means, connected to an output side of said inhibit gate means, for counting a number of control signals inputted into said memory for each address, said control signal being supplied to said memory under test through said inhibit gate means to enable the write operation of said memory.

8. The memory testing apparatus as set forth in claim 7, further comprising means for reading out respective count values of said plurality of counting means.

9. The memory testing apparatus as set forth in claim 8, further comprising a fail analyzing memory, connected to an output side of said means for reading out, for storing the respective count values read out of said counting means therein at corresponding addresses thereof.

10. An apparatus for testing semiconductor memories, comprising:

a plurality of memories under test adapted for concurrently undergoing an erase test in parallel;

pattern generating means for generating a test pattern including at least a sequence of test data, expected data and a sequence of addresses, said test pattern being concurrently applied in parallel to each of said plurality of memories under test;

a plurality of logical comparing means, each receiving data read out of a respective one of said plurality of memories under test and said expected data in a test pattern generated by said pattern generating means, and comparing said data from said one of said plurality of memories under test with said expected data, and outputting a fail signal obtained as a result of the comparison therein when said data from said one of said plurality of memories under test does not match said expected data or outputting a pass signal obtained as a result of the comparison therein when said data from said one of said plurality of memories under test match said expected data;

OR fail detecting means, receiving signals outputted from all of said plurality of logical comparing means, for detecting whether or not each of the received signals is said fail signal and, if at least one of the received signals is said fail signal, outputting it as an OR fail signal;

a plurality of signal holding means, each connected to an output side of a respective one of said plurality of logical comparing means, for holding the signals outputted from said one of said plurality of logical comparing means, respectively; and second detecting means, receiving the signals from said signal holding means, for detecting whether or not each of the received signals is said fail signal in a sequence of address generation in the test pattern generated by said pattern generating means and, if all of the received signals are said fail signal, outputting an AND fail signal that represents that all signals held in said signal holding means are fail signals, said pattern generating means including means for controlling a sequence of pattern generation depending upon the signals detected by and received from said OR fail detecting means and said second detecting means.

11. The memory testing apparatus as set forth in claim 10, wherein said pattern generating means comprises:

a sequence control part for controlling a sequence of the test pattern;

an address arithmetic part for generating an address pattern under the control of said sequence control part;

an address save register for storing an address; and save/load control means for loading a fail address corresponding to the OR fail signal to said address save register and for supplying a fail address of said address save register to said address arithmetic part corresponding to the AND fail signal when a content of said respective one of said memories under test is erased at the same time.

12. The memory testing apparatus as set forth in claim 11, wherein said pattern generating means comprises delay means for delaying an address generated by said address arithmetic part by a predetermined period of time, said predetermined period of time being selected to be substantially equal to a time interval from a time that said address is supplied to said memory under test to a time that the OR fail signal and the AND fail signal reach said save/load control means, which are generated by said OR fail detecting means and said second detecting means on the basis of the comparison results of said comparing means on data read out of said memory under test when said address is supplied thereto, and wherein said save/load control means is adapted to load a delayed address outputted from said delay means to said address save register when the OR fail signal is supplied to said save/load control means.

13. An apparatus for testing semiconductor memories, comprising:

pattern generating means for repetitively generating a sequence of addresses from an initial address to a last address in a desired sequence as well as generating a test pattern of test data to be written into a memory under test, expected data to be compared with test data read out of said memory under test, and a control signal for controlling the operation of said memory under test, and for applying the sequence of addresses, the test data, and the control signal to said memory under test, said control signal including an operation status control signal for controlling write/read operation of data into/from said memory under test;

logical comparing means, receiving data read out of said memory under test and said expected data, for comparing said data from said memory under test with said expected data and outputting a decision signal that represents a match obtained as a result of the comparison therein when said data from said memory under test matches said expected data or outputting a decision signal that represents a disaccord obtained as a result of the comparison therein when said data from said memory under test does not match said expected data;

two fail analyzing memories successively receiving a sequence of addresses from said pattern generating means and adapted for being alternately switched between a read mode and a write mode every cycle of the sequence of addresses;

inhibit gate means, receiving the last decision signal read out of one of said fail analyzing memories which is in a read mode at each of the sequence of addresses, and for inhibiting said operation status control signal from being supplied to said memory under test thereby preventing the data from being written into or being read out of said memory under test when said last decision signal is a match or supplying said operation status control signal to said memory under test thereby performing a write or read operation of the data into or out of said memory under test when said last decision signal is a disaccord; and means for writing the decision signal outputted from said logical comparing means on data read out of said memory under test into the other of said fail analyzing memories which is in a write mode.

14. The memory testing apparatus as set forth in claim 13, wherein said pattern generating means includes means for receiving said last decision signal read out of one of said fail analyzing memories, and skipping a cycle of applying the test data to said memory under test, a cycle of writing the test data into said memory under test and a cycle of reading the data out of said memory under test when said last decision signal is a match and immediately proceeding to a cycle of updating an address to be generated.

15. An apparatus for testing semiconductor memories, comprising:

pattern generator means for generating a test pattern including at least test data to be supplied to a memory under test and expected data to be compared with test data read out of said memory under test; and logical comparator means, receiving data read out of said memory under test and expected data generated from said pattern generating means, for comparing said data from said memory under test with said expected data and outputting a fail signal when said data from said memory under test does not match said expected data or outputting a match flag signal when said data from said memory under test matches said expected data, said pattern generator means comprising an address generating part, said address generating part including:

a base arithmetic part;

a destination arithmetic part;

an address descramble arithmetic part connected in cascade with said base arithmetic part and said destination arithmetic part; and a multiplexer having first and second inputs and one output and adapted for outputting a result of an address arithmetic operation, an output of said address descramble arithmetic part connected to said first input of said multiplexer and an output of said base arithmetic part connected to said second input of said multiplexer so that the output of said base arithmetic part is selectively outputted in a skip mode.

* * * * *